(12) United States Patent
Tanaka et al.

(10) Patent No.: US 8,497,557 B2
(45) Date of Patent: Jul. 30, 2013

(54) SEMICONDUCTOR DEVICE

(75) Inventors: Masaya Tanaka, Nisshin (JP); Tetsuo Fujii, Toyohashi (JP); Hisanori Yokura, Obu (JP)

(73) Assignee: DENSO CORPORATION, Kariya (JP)

( * ) Notice: Subject to any disclaimer, the term of this patent is extended or adjusted under 35 U.S.C. 154(b) by 434 days.

(21) Appl. No.: 12/754,036

(22) Filed: Apr. 5, 2010

(65) Prior Publication Data

US 2010/0252898 A1 Oct. 7, 2010

(30) Foreign Application Priority Data

Apr. 6, 2009 (JP) ................................. 2009-91793
Mar. 10, 2010 (JP) ................................. 2010-53399

(51) Int. Cl.
*H01L 29/84* (2006.01)
(52) U.S. Cl.
USPC .................... 257/415; 257/774; 257/E29.324
(58) Field of Classification Search
USPC .......................................... 257/415–420, 619
See application file for complete search history.

(56) References Cited

U.S. PATENT DOCUMENTS

| | | | |
|---|---|---|---|
| 6,566,170 B1 * | 5/2003 | Marion et al. | 438/126 |
| 6,777,263 B1 | 8/2004 | Gan et al. | |
| 6,849,916 B1 * | 2/2005 | Glenn et al. | 257/434 |
| 6,876,048 B2 | 4/2005 | Fischer et al. | |
| 7,129,576 B2 | 10/2006 | Humpston | |
| 7,153,718 B2 | 12/2006 | Fischer et al. | |
| 7,224,056 B2 | 5/2007 | Burtzlaff et al. | |
| 7,298,030 B2 | 11/2007 | McWilliams et al. | |
| 7,540,199 B2 | 6/2009 | Fujii et al. | |
| 2005/0067681 A1 | 3/2005 | De Villeneuve et al. | |
| 2005/0067688 A1 | 3/2005 | Humpston | |
| 2005/0082653 A1 | 4/2005 | McWilliams et al. | |
| 2005/0082654 A1 | 4/2005 | Humpston et al. | |
| 2005/0085016 A1 | 4/2005 | McWilliams et al. | |
| 2005/0087861 A1 | 4/2005 | Burtzlaff et al. | |
| 2005/0095835 A1 | 5/2005 | Humpston et al. | |
| 2005/0116344 A1 | 6/2005 | Humpston | |
| 2005/0189622 A1 | 9/2005 | Humpston et al. | |

(Continued)

FOREIGN PATENT DOCUMENTS

| | | |
|---|---|---|
| JP | A-2000-277465 | 10/2000 |
| JP | A-2001-35972 | 2/2001 |

(Continued)

OTHER PUBLICATIONS

Office Action mailed on Mar. 15, 2011 issued in the corresponding Japanese patent application No. 2010-053399 (English translation enclosed).

*Primary Examiner* — Ha Tran T Nguyen
*Assistant Examiner* — Raj R Gupta
(74) *Attorney, Agent, or Firm* — Posz Law Group, PLC

(57) ABSTRACT

A semiconductor device includes a first semiconductor substrate, a second semiconductor substrate, and a sealing member. The first semiconductor substrate has a surface and includes a sensing portion on the surface side. The sensing portion has a movable portion. The first semiconductor substrate and the second semiconductor substrate are bonded together to form a stacked substrate. The stacked substrate defines a hermetically sealed space for accommodating the sensing portion between the first and second semiconductor substrates. The stacked substrate further defines a recess extending between the first semiconductor substrate and the second semiconductor substrate to penetrate an interface between the first semiconductor substrate and the second semiconductor substrate. The sealing member is located in the recess.

1 Claim, 16 Drawing Sheets

U.S. PATENT DOCUMENTS

| | | |
|---|---|---|
| 2005/0189635 A1 | 9/2005 | Humpston et al. |
| 2007/0075402 A1 | 4/2007 | Geefay et al. |
| 2007/0096295 A1 | 5/2007 | Burtzlaff et al. |
| 2007/0096311 A1 | 5/2007 | Humpston et al. |
| 2007/0096312 A1 | 5/2007 | Humpston et al. |
| 2008/0030205 A1* | 2/2008 | Fujii et al. .................. 324/661 |
| 2008/0032457 A1* | 2/2008 | McWilliams et al. ........ 438/125 |
| 2008/0217752 A1 | 9/2008 | Hata et al. |
| 2009/0134459 A1 | 5/2009 | Goto et al. |
| 2009/0152656 A1 | 6/2009 | Okudo et al. |
| 2009/0229370 A1 | 9/2009 | Fujii et al. |

FOREIGN PATENT DOCUMENTS

| | | |
|---|---|---|
| JP | A-2005-251898 | 9/2005 |
| JP | 2006-351591 | 12/2006 |
| JP | A-2006-339369 | 12/2006 |
| JP | A-2009-158962 | 7/2009 |

* cited by examiner

SEMICONDUCTOR DEVICE

CROSS REFERENCE TO RELATED APPLICATION

This application is based on and incorporates herein by reference Japanese Patent Application No. 2009-91793 filed on Apr. 6, 2009 and No. 2010-53399 filed on Mar. 10, 2010.

FIELD OF THE INVENTION

The present invention relates to a semiconductor device having at least two substrates bonded together and also relates to a method of manufacturing the semiconductor device.

BACKGROUND OF THE INVENTION

Conventionally, there has been proposed a wafer level package structure. For example, JP-2005-251898A discloses a structure including a first substrate having a first sealing metal layer disposed around an element and a second substrate having a second sealing metal layer that is located facing the first sealing metal layer. In the structure, the first and second metal layers are joined together through a third conductor so that the element in the first substrate can be hermetically sealed between the first and second substrates.

The structure is obtained by joining a wafer-shaped first substrate and a wafer-shaped second substrate together through a third conductor to form a stacked wafer and by dicing (i.e., cutting) the stacked wafer into individual chips.

In the structure, the substrates are joined together only through the third conductor joined to the sealing metal layers. When force is applied to the substrates during a dicing process, a bonding force between each substrate and the metal layer and a bonding force between the third conductor and each metal layer may be weakened. As a result, the substrate and each metal layer may be separated from each other, and the third conductor and each metal layer may be separated from each other.

Further, after the stacked wafer is diced into individual chips, each chip may be subjected to external force that can weaken the bonding force between the sealing metal layer and each portion. As a result, the separation between the sealing metal layer and each portion may occur.

SUMMARY OF THE INVENTION

In view of the above, it is an object of the present invention to provide a semiconductor device including two substrates bonded together and having a structure for preventing a reduction in a bonding force at an interface between the substrates. It is another object of the present invention to provide a method of manufacturing the semiconductor device.

According to a first aspect of the present invention, a semiconductor device includes a first semiconductor substrate, a second semiconductor substrate, and a sealing member. The first semiconductor substrate has a surface and includes a sensing portion on the surface side. The sensing portion has a movable portion. The first semiconductor substrate and the second semiconductor substrate are bonded together to form a stacked substrate. The stacked substrate defines a hermetically sealed space for accommodating the sensing portion between the first and second semiconductor substrates. The stacked substrate further defines a recess that extends between the first semiconductor substrate and the second semiconductor substrate to penetrate an interface between the first semiconductor substrate and the second semiconductor substrate. The sealing member is located in the recess.

According to a second aspect of the present invention, a semiconductor device manufacturing method includes preparing a first semiconductor wafer and a second semiconductor wafer. The first semiconductor wafer has a surface and includes multiple sensing portions on the surface side. Each sensing portion has a movable portion. The method further includes bonding the first semiconductor device and the second semiconductor device to form a stacked substrate having multiple chip regions. Each chip region includes a hermetically sealed space for accommodating a corresponding sensing portion between the first and second semiconductor wafers. The method further includes forming a recess in each chip region. The recess extends between the first semiconductor wafer and the second semiconductor wafer to penetrate an interface between the first semiconductor wafer and the second semiconductor wafer. The method further includes forming a sealing member in the recess and dicing the stacked substrate in along a boundary between adjacent chip regions.

According to a third aspect of the present invention, a semiconductor device manufacturing method includes preparing a first semiconductor wafer and a second semiconductor wafer. The first semiconductor wafer has a surface and multiple first trenches on its surface side. The first semiconductor wafer further includes multiple sensing portions on the surface side. Each sensing portion has a movable portion. The second semiconductor wafer has a surface and includes multiple second trenches on its surface side. The method further includes bonding the surface of the second semiconductor wafer to the surface of the first semiconductor wafer in such a manner that each first trench communicates with a corresponding second trench to form a stacked substrate. The stacked substrate has multiple chambers defined by the first trenches and the second trenches. The stacked substrate further has multiple chip regions. Each chip region includes a hermetically sealed space for accommodating a corresponding sensing portion between the first semiconductor wafer and the second semiconductor wafer. The method further includes forming multiple via holes in the stacked substrate. Each via hole extends to a corresponding chamber from outside the stacked substrate. The method further includes filling each chamber with a sealing member through a corresponding via hole. The method further includes dicing the stacked substrate into multiple semiconductor devices along a dicing line on each via hole so that a recess filled with the sealing material is formed in a side surface of each semiconductor device.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Embodiments of the present invention are described below with reference to the drawings.

First Embodiment

Figure 1A:
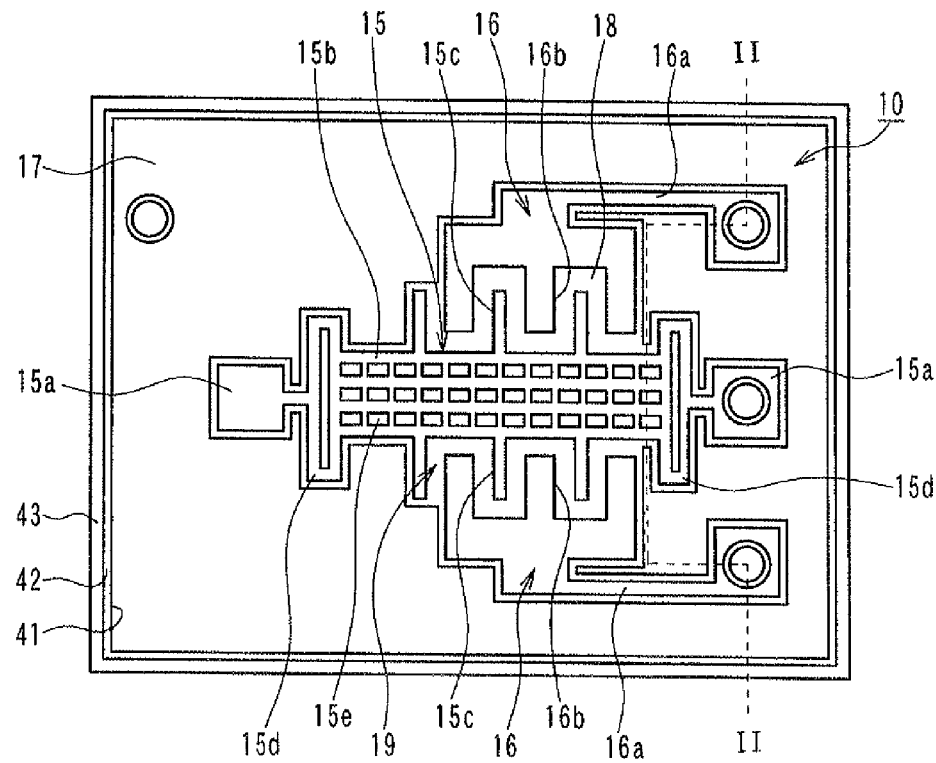
FIG. 1A is a diagram illustrating a plan view of a sensor section of a semiconductor device according to a first embodiment of the present invention.

A semiconductor device according to a first embodiment of the present invention is described below with reference to FIGS. 1A and 1B, and FIG. 2. For example, the semiconductor device can be a dynamic quantity sensor having a movable portion such as an acceleration sensor for detecting an acceleration of a vehicle.

Figure 1B:
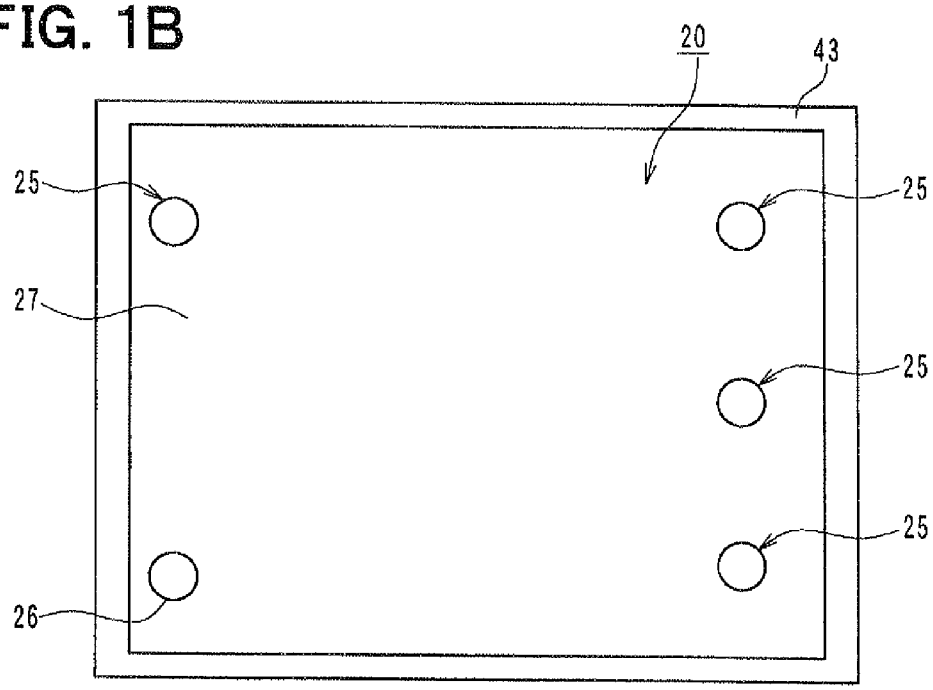
FIG. 1B is a diagram illustrating a plan view of a cap section of the semiconductor device.
Figure 2:
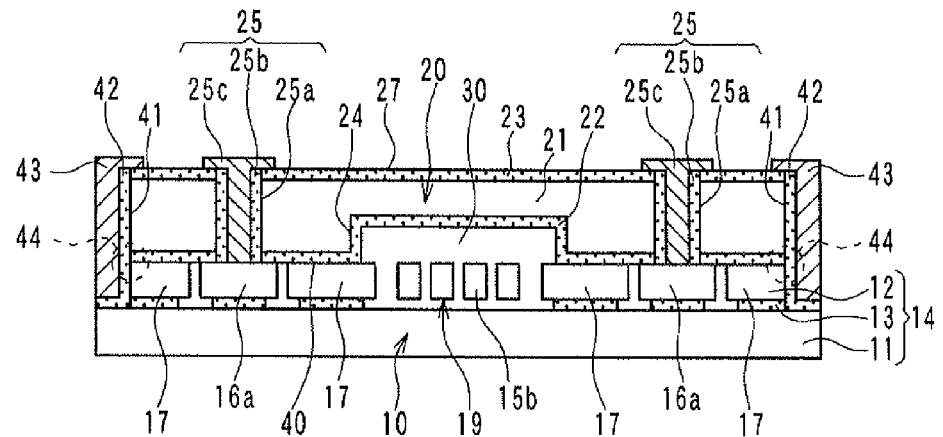
FIG. 2 is a diagram illustrating a cross-sectional view taken along the line II-II in FIG. 1A.

Referring to FIG. 2, the semiconductor device includes a sensor section 10 and a cap section 20 that are stacked on top of each other. FIG. 1A is a plan view of the sensor section 10. FIG. 1B is a plan view of the cap section 20. FIG. 2 is a cross-sectional view of the semiconductor device taken along the line II-II in FIG. 1A.

Firstly, the sensor section 10 is described. The sensor section 10 is configured to detect a physical quantity such as an acceleration. As shown in FIG. 2, the sensor section 10 is based on a silicon-on-insulator (SOI) substrate 14 including a supporting substrate 11, a semiconductor layer 12, and a sacrificial layer 13. The sacrificial layer 13 is sandwiched between a front surface of the supporting substrate 11 and the semiconductor layer 12.

For example, each of the supporting substrate 11 and the semiconductor layer 12 can be made of N-type monocrystalline silicon. For example, the sacrificial layer 13 can be made of $SiO_2$.

The sacrificial layer 13 serves to maintain a predetermined distance between the supporting substrate 11 and the semiconductor layer 12. As shown in FIG. 1A, the semiconductor layer 12 includes a movable portion 15, a fixed portion 16, and a peripheral portion 17.

The semiconductor layer 12 has an opening 18. The opening 18 penetrates the semiconductor layer 12 to define the movable portion 15, the fixed portion 16, and the peripheral portion 17. That is, the opening 18 is formed in the semiconductor layer 12 so that the semiconductor layer 12 can be separately divided (i.e., sectioned) into the movable portion 15, the fixed portion 16, and the peripheral portion 17. The movable portion 15 and the fixed portion 16 form s sensing portion 19 for detecting a physical quantity such as an acceleration.

The movable portion 15 has a movable structure on one side of the sensor section 10. That is, the movable structure is formed in the semiconductor layer 12.

Specifically, the movable portion 15 includes an anchor 15a, a weight 15b, a movable electrode 15c, and a beam 15d.

The anchor 15a supports the weight 15b so that the weight 15b can be suspended above the supporting substrate 11. For example, the anchor 15a can have a block-shape and be placed in two positions on the sacrificial layer 13.

The weight 15b causes the movable electrode 15c to be displaced with respect to the anchor 15a, when a physical quantity such as an acceleration is applied to the semiconductor device. The weight 15b has a long and thin shape. Multiple etching holes 15e are formed in the weight 15b. The etching holes 15e are used to introduce an etchant that is used to remove the sacrificial layer 13 between the weight 15b and the supporting substrate 11.

The movable electrode 15c extends from the weight 15b in a direction perpendicular to the weight 15b. Multiple movable electrodes 15c are arranged to form a comb-shaped electrode. Adjacent movable electrodes 15c are evenly spaced from each other. Each movable electrode 15c has the same width and the same length.

The beam 15d couples the anchor 15a and the weight 15b. The beam 15d has two parallel portions that are connected at both ends to form a rectangular frame shape. The beam 15d can serve as a spring that is deformable in a direction perpendicular to a longitudinal direction of the parallel portions. The weight 15b is integrally joined and supported to the anchor 15a through the beam 15d. In the first embodiment, two anchors 15a are joined to the weight 15b through two beams 15d, respectively.

The sacrificial layer 13 located under the beam 15d, the weight 15b, and the movable electrode 15c are partially removed so that the beam 15d, the weight 15b, and the movable electrode 15c can be suspended above the supporting substrate 11 by a predetermined separation distance. The separation distance is a distance between the semiconductor layer 12 and the supporting substrate 11 and corresponds to a thickness of the sacrificial layer 13.

The fixed portion 16 is located facing a long side of the weight 15b of the movable portion 15 so that the weight 15b can be located between two fixed portions 16. The fixed portion 16 includes a wire 16a and a fixed electrode 16b.

The wire 16a serves to electrically connect the fixed electrode 16b to external circuitry. The sacrificial layer 13 is left under the wire 16a so that the wire 16a can be fixed to the supporting substrate 11 through the sacrificial layer 13.

The fixed electrode 16b extends from one side of the wire 16a in a direction perpendicular to the side of the wire 16a toward the weight 15b. Multiple fixed electrodes 16b are arranged to form a comb-shaped electrode. Adjacent fixed electrodes 16b are evenly spaced from each other. Each fixed electrode 16b has the same width and the same length.

The fixed electrode 16b and the movable electrode 15c are located facing each other to form a capacitor therebetween. A physical quantity is detected based on a capacitance of the capacitor. Specifically, when a physical quantity such as an acceleration is applied to the semiconductor device in a planer direction of the supporting substrate 11 and in the longitudinal direction of the weight 15b, the applied physical quantity can be detected based on a change in the capacitance of the capacitor.

In the first embodiment, the sacrificial layer 13 located between the fixed electrode 16b and the supporting substrate 11 is removed so that the fixed electrode 16b can be suspended above the supporting substrate 11.

The peripheral portion 17 is located around the movable portion 15 and the fixed portion 16. In the first embodiment, the peripheral portion 17 entirely surrounds the movable portion 15 and the fixed portion 16.

Next, the cap section 20 is described. The cap section 20 serves to prevent a foreign matter such as water from entering the sensing portion 19. The cap section 20 and the sensor section 10 form a sealed space therebetween.

The cap section 20 is made of a semiconductor material such as silicon. As shown in FIG. 2, the cap section 20 includes a silicon substrate 21, a first insulation layer 22, and a second insulation layer 23. The silicon substrate 21 has a first surface and a second surface opposite to the first surface. The first insulation layer 22 is formed on the first surface of the silicon substrate 21, and the second insulation layer 23 is formed on the second surface of the silicon substrate 21.

The first surface of the silicon substrate 21 is recessed to form a recessed portion 24. The recessed portion 24 faces the sensing portion 19 of the sensor section 10, when the sensor section 10 and the cap section 20 are bonded together. Thus, the recessed portion 24 prevents the sensing portion 19 from touching the cap section 20, when the sensor section 10 and the cap section 20 are bonded together.

The first insulation layer 22 is formed all over the first surface of the silicon substrate 21 including the recessed portion 24. The first insulation layer 22 electrically insulates the sensor section 10 from the silicon substrate 21. The second insulation layer 23 is formed on the second surface of the silicon substrate 21. Each of the first and second insulation layers 22, 23 can be made of an insulation material such as $SiO_2$.

The cap section 20 has multiple through electrode members 25. Each through electrode member 25 penetrates the cap section 20 in a stack direction in which the sensor section 10 and the cap section 20 are stacked on top of each other.

The through electrode member 25 includes a through hole 25a, an insulation layer 25b, and a through electrode 25c. The through hole 25a penetrates the second insulation layer 23, the silicon substrate 21, and the first insulation layer 22. The insulation layer 25b is formed on a wall of the through hole 25a. The through electrode 25c is formed on the insulation layer 25b to fill the through hole 25a. A first end of the through electrode 25c is connected to the anchor 15a, for example. A second end of the through electrode 25c is patterned to from a pad, as shown in FIG. 1B. For example, the insulation layer 25b can be made of an insulation material such as tetraethoxysilane (TEOS), and the through electrode 25c can be made of a metal material such as aluminum (Al).

In the first embodiment, four through electrode members 25 are formed in the cap section 20. Two of the four through electrode members 25 are electrically connected to the fixed portion 16 of the sensing portion 19. Another of the four through electrode members 25 is electrically connected to the anchor 15a of the movable portion 15. The other of the four through electrode members 25 is electrically connected to the peripheral portion 17.

As shown in FIG. 1B, a potential taking electrode 26 for taking an electrical potential of the silicon substrate 21 is formed in the cap section 20. The potential taking electrode 26 is electrically connected to the silicon substrate 21 via a contact hole (not shown) that is formed in the second insulation layer 23.

As shown in FIG. 2, the sensor section 10 and the cap section 20 are bonded together to form a stacked body. In the first embodiment, the sensor section 10 and the cap section 20 are bonded together by direct bonding of the first insulation layer 22 of the cap section 20 to the semiconductor layer 12 of the sensor section 10. In this way, the sensor section 10 and the cap section 20 are stacked on top of each other to form a hermetically-sealed space 30 for accommodating the sensing portion 19 between the sensor section 10 and the cap section 20. Specifically, the sealed space 30 is formed between the sensor section 10 and the recessed portion 24 of the cap section 20, and the sensing portion 19 is hermetically sealed in the sealed space 30. For example, the sealed space 30 can be under vacuum.

Further, a recess 41 is formed in the stacked body, which is formed by bonding the sensor section 10 and the cap section 20 together. The recess 41 extends between the sensor section 10 and the cap section 20 to penetrate an interface 40 between the sensor section 10 and the cap section 20. It is noted that the interface 40 corresponds to a contact surface between the semiconductor layer 12 of the sensor section 10 and the first insulation layer 22 of the cap section 20. For example, the recess 41 can have a width of about 100 μm. An insulation layer 42 is formed on a wall of the recess 41. A sealing metal layer 43 is formed on the insulation layer 42 to fill the recess 41. Thus, the insulation layer 42 and the sealing metal layer 43 are located in the recess 41. In thus way, the sensor section 10, the cap section 20, the insulation layer 42, and the sealing metal layer 43 form a wedge 44. That is, the insulation layer 42 and the sealing metal layer 43 can serve to join the sensor section 10 and the cap section 20.

As shown in FIG. 1B, the recess 41, the insulation layer 42, and the sealing metal layer 43 are located on the entire outer edge of a surface 27 of the second insulation layer 23 of the cap section 20. Accordingly, the wedge 44 is located on the entire outer edge of the surface 27 of the second insulation layer 23. It is noted that the surface 27 can be seen when the cap section 20 bonded to the sensor section 10 is viewed from the stack direction. Specifically, the wedge 44 is located on the outermost edge of the surface 27 of the second insulation layer 23. That is, as shown in FIG. 2, the insulation layer 42 and the sealing meal layer 43 are exposed to a side surface of the semiconductor device to define the side surface of the semiconductor device. The insulation layer 42 and the sealing metal layer 43 exposed to the side surface of the semiconductor device define a dicing surface.

For example, the insulation layer 42 can be made of an insulation material such as tetraethoxysilane (TEOS), and the sealing metal layer 43 can be made of a metal material such as aluminum (Al).

As described above, the insulation layer 42 and the sealing metal layer 43 are located on the outermost edge of the surface 27 of the second insulation layer 23. Therefore, as can be seen from FIG. 1B, each through electrode member 25 is located closer to the center of the surface 27 than the insulation layer 42 and the sealing metal layer 43. In other words, each through electrode member 25 is located closer to the center of the surface 27 than the wedge 44.

Figure 3A:
FIGS. 3A-3C are diagrams illustrating processes of manufacturing the sensor section.
Figure 3B:
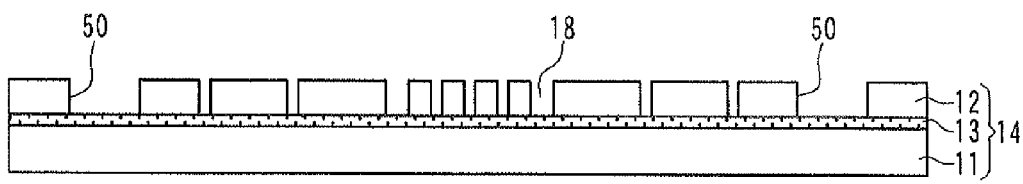
Figure 3C:
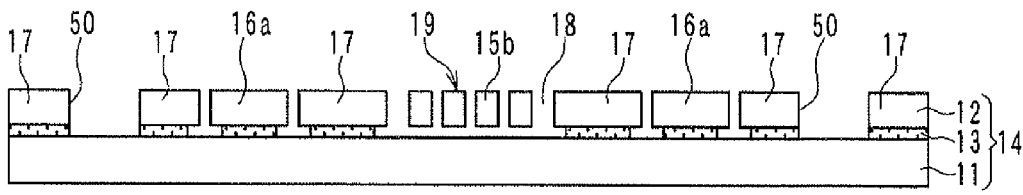
Figure 4A:
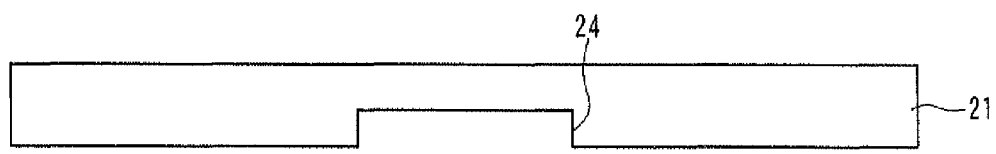
FIGS. 4A-4C are diagrams illustrating processes of manufacturing the cap section.
Figure 4B:
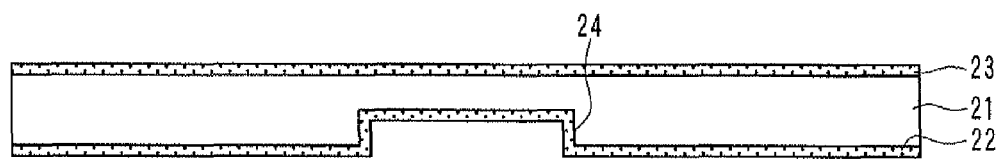
Figure 4C:
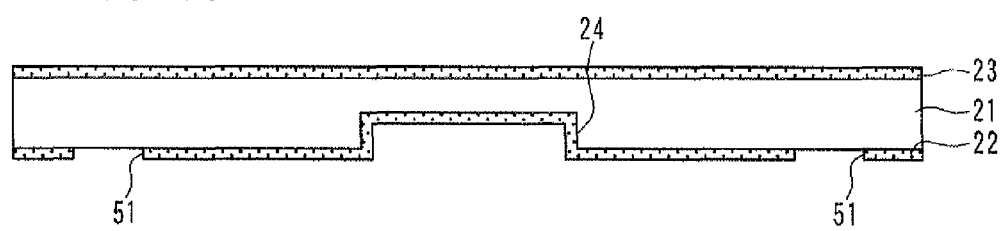
Figure 5A:
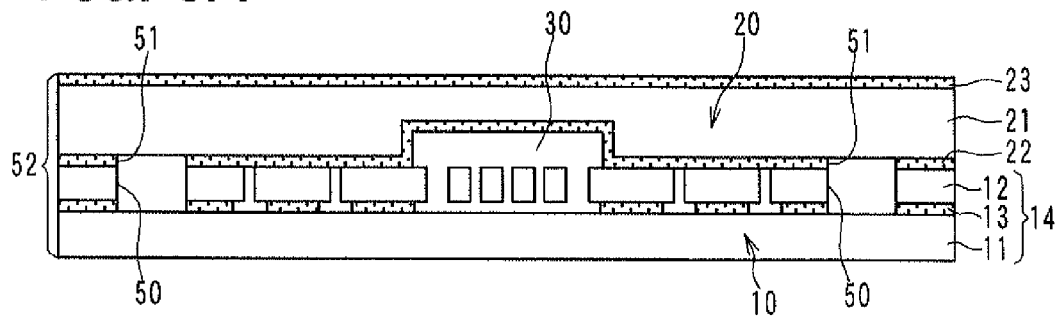
FIGS. 5A-5D are diagrams illustrating processes of bonding the sensor section and the cap section together to form a stacked wafer.

A method of manufacturing the semiconductor device is described below with reference to FIGS. 3A-3C, FIGS. 4A-4C, FIGS. 5A-5D, and FIG. 6. FIGS. 3A-3C depict processes of manufacturing the sensor section 10. FIGS. 4A-4C depict processes of manufacturing the cap section 20. FIGS. 5A-5D depict processes of bonding the sensor section 10 and the cap section 20 together to form a stacked body. FIG. 6 depicts a process of dicing the stacked body individual semiconductor devices. Each of FIGS. 3A-3C, FIGS. 4A-4C, FIGS. 5A-5D, and FIG. 6 corresponds to a cross-sectional view taken along the line II in FIG. 1A.

Firstly, the method of manufacturing the sensor section 10 is described below. In a process shown in FIG. 3A, the SOI substrate 14 including the sacrificial layer 13 sandwiched between the supporting substrate 11 and the semiconductor layer 12 is prepared. For example, the SOI substrate 14 can be a 5-inch wafer. The wafer-shaped SOI substrate 14 will be formed into multiple sensor sections 10 in later processes.

In a process shown in FIG. 3B, the opening 18 is formed in the semiconductor layer 12. Specifically, a mask (not shown) is formed on the semiconductor layer 12 and then patterned to have an opening corresponding to the opening 18 and the recess 41. Thus, the semiconductor layer 12 is partially exposed through the opening of the mask. For example, the mask can be made of a resist or an oxide film.

Then, the semiconductor layer 12 exposed through the mask is etched by reactive ion etching (RIE), for example. In this way, the opening 18 and a trench 50 corresponding to the recess 41 are formed in the semiconductor layer 12. It is noted that the opening 18 and the trench 50 penetrate the semiconductor layer 12 so that the sacrificial layer 13 can be partially exposed through the opening 18 and the trench 50 of the semiconductor layer 12. Then, the mask is removed.

In a process shown in FIG. 3C, the sacrificial layer 13 exposed through the semiconductor layer 12 is removed by sacrificial layer etching, for example. As a result, the beam 15d, the weight 15b, the movable electrode 15c, and the fixed electrode 16b are separated from the supporting substrate 11 so that the sensing portion 19 can be formed. Since the sacrificial layer 13 on a bottom of the trench 50 is removed, the supporting substrate 11 defines the bottom of the trench 50. In this way, the wafer-shaped SOI substrate 14 is formed into multiple sensor sections 10.

Next, the method of manufacturing the cap section 20 is described. In a process shown in FIG. 4A, the silicon substrate 21 is prepared. The silicon substrate 21 has the same size as the SOI substrate 14. That is, the silicon substrate 21 has a wafer-shape. The first surface of the silicon substrate 21 is partially etched to form the recessed portion 24 having a depth of about 5 μm to about 10 μm. As mentioned previously, the recessed portion 24 provides a space in which the movable portion such as the weight 15b can move.

In the process shown in FIG. 4A, the recessed portion 24 is formed by using a photolithographic technique and an etching technique such as RIE etching or alkaline etching.

In a process shown in FIG. 4B, the first insulation layer 22 such as $SiO_2$ is formed on the first surface of the wafer-shaped silicon substrate 21 by a chemical vapor deposition (CVD) technique, for example. Likewise, the second insulation layer 23 such as $SiO_2$ is formed on the second surface of the wafer-shaped silicon substrate 21 by a CVD technique, for example.

In a process shown in FIG. 4C, an opening 51 is formed in the first insulation layer 22 so that the silicon substrate 21 can be exposed through the opening 51 at a position corresponding to the trench 50 of the semiconductor layer 12 of the sensor section 10. In this way, the wafer-shaped silicon substrate 21 is formed into multiple cap sections 20. It is noted that the cap sections 20 are still incomplete at this time.

Then, the sensor sections 10 formed through the processes 3A-3C and the cap sections 20 formed through the processes 4A-4C are bonded together. Specifically, in a process shown in FIG. 5A, the wafer-shaped SOI substrate 14 having the sensor sections 10 and the wafer-shaped silicon substrate 21 having the incomplete cap sections 20 are placed in a vacuum apparatus (not shown). Then, an argon (Ar) ion beam is applied to a surface of the semiconductor layer 12 of the SOI substrate 14 and a surface of the first insulation layer 22 of the cap section 20. Thus, the surfaces of the semiconductor layer 12 and the first insulation layer 22 are activated. Alternatively, the surfaces of the semiconductor layer 12 and the first insulation layer 22 can be activated by performing a plasma treatment in atmosphere or vacuum.

Next, in the vacuum apparatus, the wafer-shaped SOI substrate 14 and the wafer-shaped silicon substrate 21 are aligned with respect to each other by infrared microscopy based on alignment marks on opposing surfaces of the 501 substrate 14 and the silicon substrate 21 and then bonded together by a so-called direct bonding at a low temperature of from about room temperature to about 550° C. In this way, the wafer-shaped SOI substrate 14 and the wafer-shaped silicon substrate 21 are bonded together to form a stacked wafer 52. As a result, in each chip region 53, the sealed space 30 under vacuum is formed between the SOI substrate 14 and the recessed portion 24. Further, the opening 51 of the first insulation layer 22 of the cap section 20 communicates with the trench 50 of the sensor section 10. Alliteratively, the sensor section 10 and the cap section 20 can be bonded together by a bonding method other than direct bonding. For example, the sensor section 10 and the cap section 20 can be bonded together by anodic bonding or interlayer bonding.

Figure 5B:
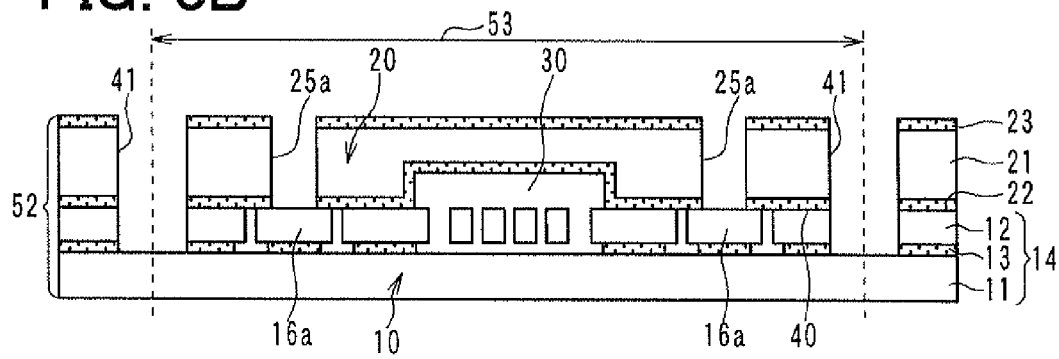
Figure 6:
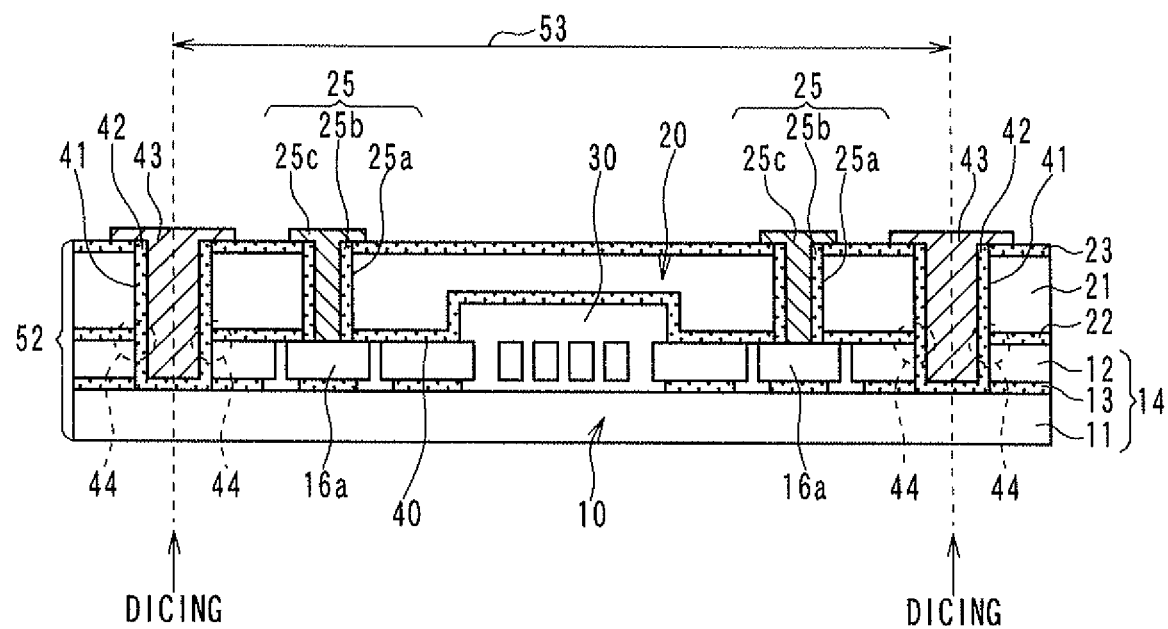
FIG. 6 is a diagram illustrating a process of dicing the wafer into individual chips.

In a process shown in FIG. 5B, the recess 41 and the through hole 25a are formed in the stacked wafer 52 by RIE etching, for example. It is noted that the stacked wafer 52 has multiple chip regions 53, each of which corresponds to one semiconductor device. The recess 41 is formed in each chip region 53 of the stacked wafer 52. The recess 41 penetrates the interface 40 between the sensor section 10 and the cap section 20.

Specifically, the recess 41 is formed on the entire outer edge of the chip region 53. Further, the recess 41 is formed so that a boundary between adjacent chip regions 53 can be located in the recess 41. That is, the recess 41 crosses (i.e., straddles) the boundary between adjacent chip regions 53. In this way, multiple recesses 41 are formed in the stacked wafer 52 in a grid pattern.

As mentioned above, the trench 50 is formed in the semiconductor layer 12 in the process shown in FIG. 3B, and the opening 51 is formed in the first insulation layer 22 in the process shown in FIG. 4C. Therefore, in the process shown in FIG. 5B, the recess 41 can be formed in the stacked wafer 52 only by etching the second insulation layer 23 and the silicon substrate 21 at a position corresponding to the trench 50.

Further in the process shown in FIG. 5B, multiple through holes 25a are formed in the stacked wafer 52 by etching the second insulation layer 23, the silicon substrate 21, and the first insulation layer 22 at a position corresponding to the wire 16a, the anchor 15a, and the peripheral portion 17.

Figure 5C:
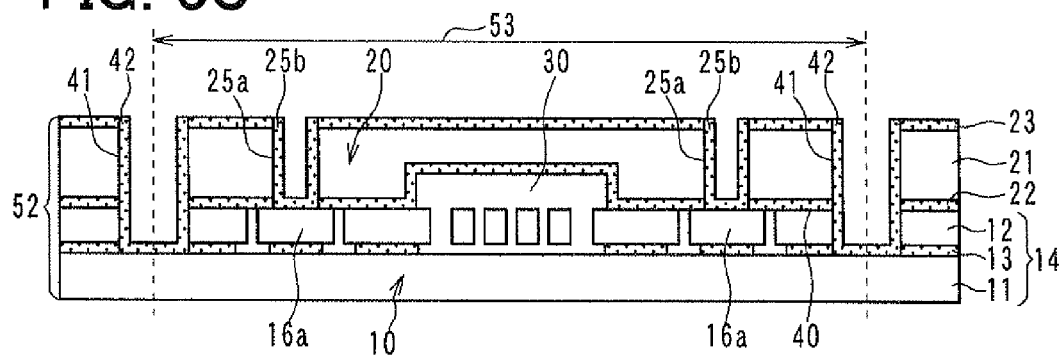

In a process shown in FIG. 5C, the insulation layer 25b such as TEOS is formed on the wall of the through hole 25a. Likewise, the insulation layer 42 such as TEOS is formed on the wall of the recess 41.

Figure 5D:
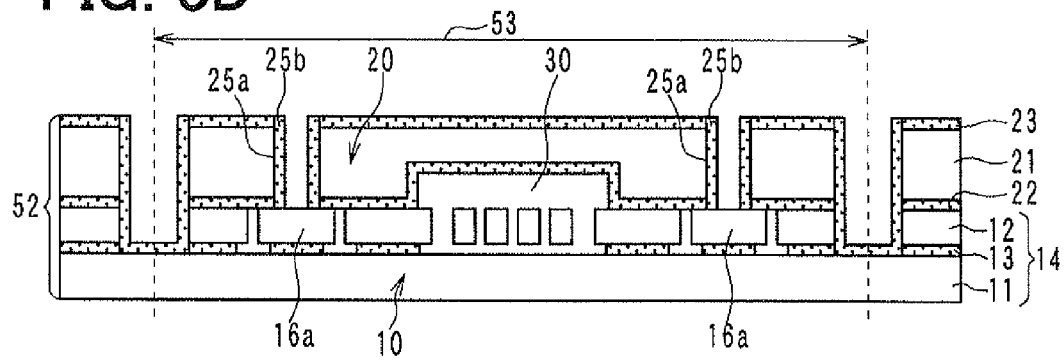

In a process shown in FIG. 5D, the insulation layer 25b on the bottom of the through hole 25a is removed so that the semiconductor layer 12 can be exposed. Further, a contact hole (not shown) is formed in the second insulation layer 23 so that the silicon substrate 21 can be exposed. It is noted that the contact hole in the second insulation layer 23 can be formed in the same process as other portions or in a different process from the other portions.

Then, in a process shown in FIG. 6, the sealing metal layer 43 and the through electrode 25c are formed by filling the recess 41 and the through hole 25a with metal such as aluminum (Al) or aluminum-silicon alloy (Al—Si) by a sputtering method, a deposition method, or the like. Further, the metal on the second insulation layer 23 is formed into a pad by patterning so that the through electrode 25c and the sealing metal layer 43 can have a substantially T-shape in cross section. Thus, the pad serves as a lid and improves airtightness of the sealed space 30. Since the through electrode 25c and the sealing metal layer 43 are formed by using the same material, the manufacturing process of the semiconductor device is simplified.

As described above, the recess 41 is formed on the boundary between adjacent chip regions 53. Accordingly, the sealing metal layer 43 is formed on the boundary between adjacent chip regions 53 so that the insulation layer 42 and the sealing metal layer 43 can be formed in the recess 41. Thus, the cap section 20, the sensor section 10, the insulation layer 42, and the sealing metal layer 43 form the wedge 44.

Further, since the through electrodes 25c are formed in the through holes 25a, the through electrodes 25c are electrically connected to the wire 16a, the anchor 15a, and the peripheral portion 17, respectively. Furthermore, the potential taking electrode 26 is formed in the cap section 20 and electrically connected to the silicon substrate 21.

Then, the stacked wafer 52 is diced along the boundary between adjacent chip regions 53. In this case, the sealing metal layer 43 and the insulation layer 42 on the bottom of the recess 41 are cut along the boundary.

Therefore, when the stacked wafer 52 is diced, a blade of a dicing saw touches the sealing metal layer 43 and the insulation layer 42 on the bottom of the recess 41. In other words, the stacked wafer 52 is diced in such a manner that the blade of the dicing saw does not directly touch the interface 40 between the sensor section 10 and the cap section 20. Thus, when the stacked wafer 52 is diced into individual chips (i.e., individual semiconductor devices), the sealing metal layer 43 and the insulation layer 42 are partially left on the semiconductor device to define the side surface of the semiconductor device. Specifically, the supporting substrate 11, the insulation layer 42, and the sealing metal layer 43 define a dicing surface of the semiconductor device.

In such a structure, external force due to the dicing process is applied to the sealing metal layer 43 and the insulation layer 42, but is not directly applied to the interface 40 between the sensor section 10 and the cap section 20. Therefore, a reduction in a bonding force between the sensor section 10 and the cap section 20 due to the dicing process can be prevented. In this way, the semiconductor device is completed.

How a physical quantity such as an acceleration is detected in the semiconductor device is described next. For example, when an acceleration is applied to the semiconductor device, the beam 15d of the movable portion 15 is deformed so that the weight 15b can be displaced in its longitudinal direction with respect to the fixed electrode 16b. Accordingly, the distance between the movable electrode 15c and the fixed electrode 16b changes. As a result, the capacitance of the capacitor that is formed with the movable electrode 15c and the fixed electrode 16b changes. The acceleration applied to the semiconductor device is detected by detecting the capacitance change.

An advantage of forming the recess 41, the insulation layer 42, and the sealing metal layer 43 in the semiconductor device is described below. As described above, the semiconductor device according to the first embodiment includes the sensor section 10, the cap section 20 bonded to the sensor section 10, the recess 41 penetrating the interface 40 between the sensor section 10 and the cap section 20, the insulation layer 42 placed in the recess 41, and the sealing metal layer 43 placed in the recess 41. In other words, the semiconductor device according to the first embodiment includes the sensor section 10, the cap section 20 bonded to the sensor section 10, and the wedge 44 that is formed by placing the insulation layer 42 and the seating metal layer 43 in the recess 41 that penetrates the interface 40 between the sensor section 10 and the cap section 20.

In such a structure, the insulation layer 42 and the sealing metal layer 43 in the recess 41 can serve as a shield for preventing external force from being directly applied to the interface 40 that is located closer to the center of the semiconductor device than the recess 41. Thus, the insulation layer 42 and the sealing metal layer 43 in the recess 41 can prevent the reduction in the bonding force between the sensor section 10 and the cap section 20. Further, the insulation layer 42 and the sealing metal layer 43 in the recess 41 form the wedge 44 for joining the sensor section 10 and the cap section 20 together. Thus, the insulation layer 42 and the sealing metal layer 43 in the recess 41 can prevent a separation between the sensor section 10 and the cap section 20 at the interface 40.

In other wards, the recess 41 is located on the side surface of the semiconductor device and recessed inwardly to cross (i.e., straddle) a junction (i.e., the interface 40) between the sensor section 10 and the cap section 20. The insulation layer 42 and the sealing metal layer 43 are located in the recess 41 to cover the junction between the sensor section 10 and the cap section 20. Thus, the insulation layer 42 and the sealing metal layer 43 in the recess 41 prevents external force from being directly applied to the junction and thereby prevents the separation between the sensor section 10 and the cap section 20 at the junction.

Therefore, an end of the interface 40 between the sensor section 10 and the cap section 20 is at least partially terminated inside the semiconductor device. According to the first embodiment, since the wedge 44 is located on the outer edge of the surface 27 of the cap section 20, the end of the interface 40 is fully terminated inside the semiconductor device. That is, the end of the interface 40 is not exposed to the side surface of the semiconductor device. Therefore, it is less likely that external force applied to the side surface of the semiconductor device is transmitted to the interface 40. Accordingly, the external force transmitted to the interface 40 is reduced so that it is less likely that the sensor section 10 and the cap section 20 are separated from each other due to the external force.

The insulation layer 42 and the sealing metal layer 43 cross the interface 40 in the stack direction and are joined to each of the sensor section 10 and the cap section 20. Thus, the insulation layer 42 and the sealing metal layer 43 can serve as a joint for joining the sensor section 10 and the cap section 20 together. The semiconductor device is manufactured by dicing the stacked wafer 52 in the stack direction in such a manner that the joint is partially left on the semiconductor device. Therefore, most of the dicing force is applied to the joint so that the dicing force applied to the interface 40 can be reduced. In this way, the joint can reduce the separation between the sensor section 10 and the cap section 20 at the interface 40.

As described above, according to the first embodiment, the sensor section 10 and the cap section 20 are stacked on top of each other to form a stacked body, and the recess 41 is formed in the stacked body in such a manner that the recess 41 penetrates the interface 40 between the sensor section 10 and the cap section 20. Further, the insulation layer 42 and the sealing metal layer 43 are located in the recess 41. Thus, the insulation layer 42 and the sealing metal layer 43 can serve as a sealing member for sealing the recess 41.

The sealing member formed with the insulation layer 42 and the sealing metal layer 43 can serve as a shield for preventing external force from being directly applied to the interface 40 that is located closer to the center of the semiconductor device than the sealing member. Therefore, even when the dicing force is applied to the stacked wafer 52, the sealing member can prevent the reduction in the bonding force between the sensor section 10 and the cap section 20. Further, after the stacked wafer 52 is diced into individual semiconductor devices, the sealing member is partially left on the semiconductor device. Therefore, even when external force is applied to the semiconductor device as a completed device, the sealing member can serve as a shield for preventing external force from being directly applied to the interface 40. Thus, the sealing member can prevent the reduction in the bonding force between the sensor section 10 and the cap section 20, even after the stacked wafer 52 is diced into individual semiconductor devices.

Further, according to the first embodiment, the recess 41 is located on the entire outer edge of the surface 27 of the cap section 20 so that the end of the interface 40 is not exposed outside the semiconductor device. Therefore, even when external force is applied to the semiconductor device in any direction, the insulation layer 42 and the sealing metal layer 43 in the recess 41 can reduce the external force transmitted to the interface 40. Thus, the reduction in the bonding force between the sensor section 10 and the cap section 20 can be surely prevented.

In the semiconductor device, the sealed space 30 is formed between the sensor section 10 and the cap section 20. Since the reduction in the bonding force between the sensor section 10 and the cap section 20 is prevented as describe above, a reduction in the airtightness of the sealed space 30 is prevented accordingly.

In the semiconductor device, the though electrode member 25 is formed in the cap section 20. Since the reduction in the bonding force between the sensor section 10 and the cap section 20 is prevented as describe above, electrical connection between the through electrode member 25 and the sensing portion 19 is maintained accordingly.

The sensor section 10 corresponds to a first substrate, and the cap section 20 corresponds to a second substrate. The insulation layer 42 and the metal sealing layer 43 correspond to a sealing member.

Second Embodiment

A semiconductor device according to a second embodiment of the present invention is described below with reference to FIGS. 7A, 7B, and 8. A difference between the first and second embodiments is as follows. In the first embodiment, the stacked wafer 52 is diced into individual semiconductor devices by dicing the insulation layer 42 and the metal sealing layer 43. In contrast, in the second embodiment, the stacked wafer 52 is diced into individual semiconductor devices by dicing a portion outside the insulation layer 42 and the metal sealing layer 43.

Figure 7A:
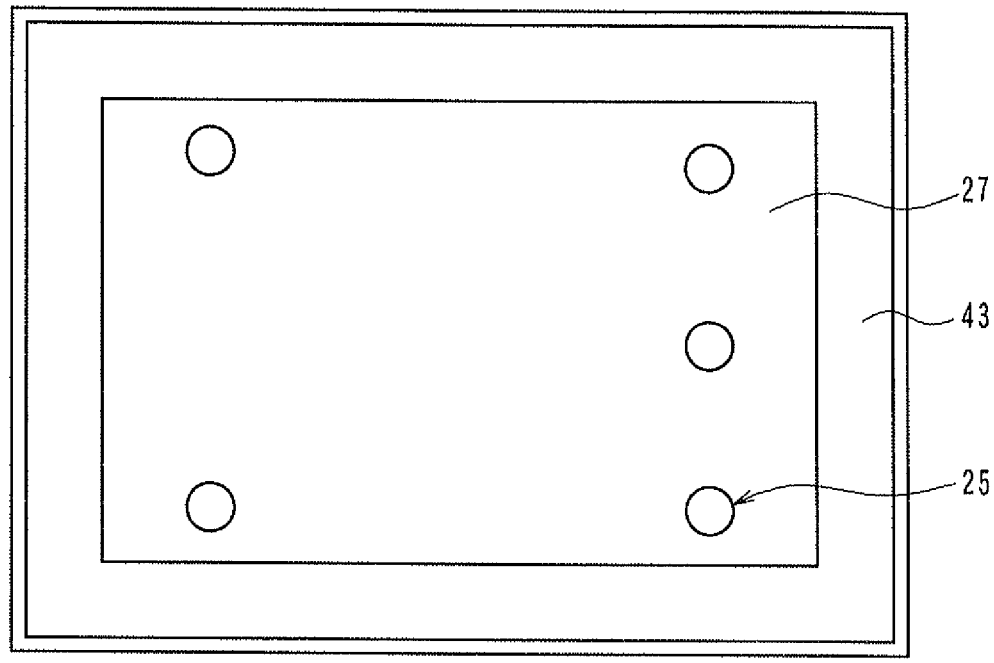
FIG. 7A is a diagram illustrating a plan view of a cap section of a semiconductor device according to a second embodiment of the present invention.
Figure 7B:
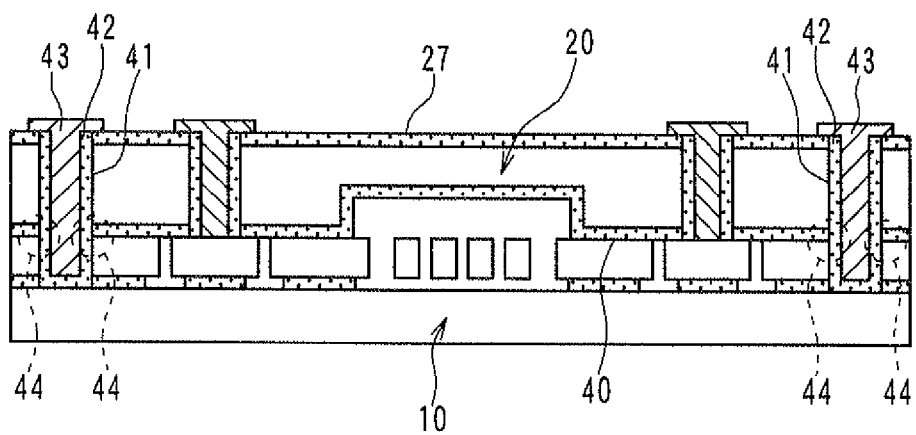
FIG. 7B is a diagram illustrating a cross-sectional view of the semiconductor device according to the second embodiment.

FIG. 7A is a plan view of a cap section 20 of the semiconductor device according to the second embodiment, and FIG. 7B, corresponding to FIG. 2, is a cross-sectional view of the semiconductor device according to the second embodiment.

As shown in FIG. 7B, the recess 41, the insulation layer 42, and the sealing metal layer 43 are located closer to the center of the semiconductor device than the side surface of the semiconductor device. Further, as shown in FIG. 7A, the sealing metal layer 43 is located on the entire outer edge of the surface 27 of the cap section 20. In such an approach, the wedge 44 is formed on each of an inner periphery and an outer periphery of the sealing metal layer 43.

Figure 8:
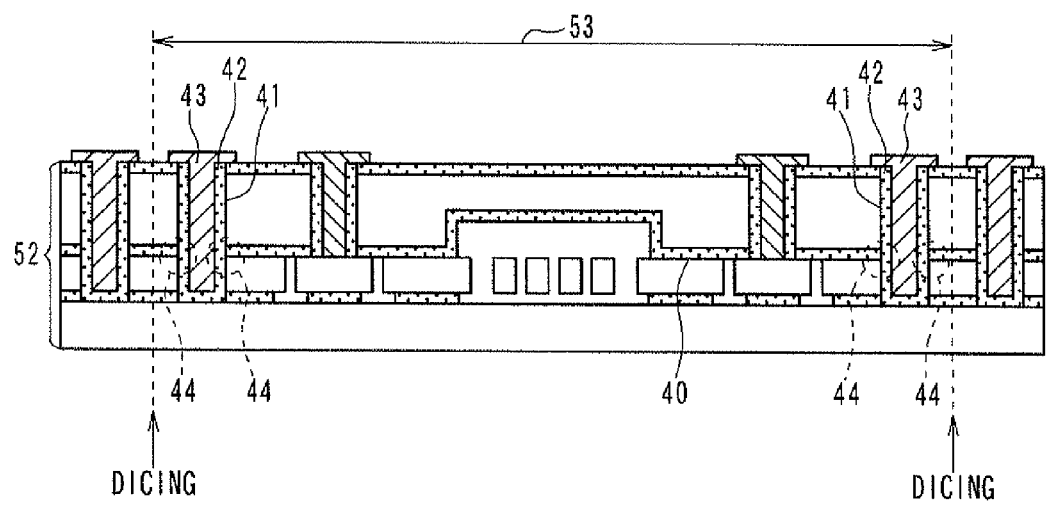
FIG. 8 is a diagram illustrating a process of dicing a stacked wafer into individual chips according to the second embodiment.

FIG. 8 is a cross-sectional view of a process of dicing the stacked substrate 52 into individual semiconductor devices according to the second embodiment. As shown in FIG. 8, a boundary between adjacent chip regions 53 is located between adjacent recesses 41, and the insulation layer 42 and the sealing metal layer 43 are placed in each recess 41.

The stacked substrate 52 is diced along the boundary between adjacent chip regions 53. In such an approach, since the blade of the dicing saw does not directly touch the sealing metal layer 43, a deformation of the sealing metal layer 43 can be prevented. Further, after the stacked wafer 52 is diced into individual semiconductor devices, the sealing metal layer 43 is located closer to the center of the semiconductor device than the side surface of the semiconductor device. In other words, the sealing metal layer 43 is not exposed to the side surface of the semiconductor device as a completed product. Therefore, the insulation layer 42 and the sealing metal layer 43 serve as a shield for preventing external force from being directly applied to the interface 40 that is located closer to the center of the semiconductor device than the recess 41. In the example shown in FIG. 8, the SOI substrate 14, the silicon substrate 21, the first insulation layer 22, and the second insulation layer 23 define the dicing surface.

As described above, according to the second embodiment, the boundary between adjacent chip regions 53 is located between adjacent recesses 41, and the stacked substrate 52 is diced along the boundary between adjacent chip regions 53. In such an approach, the insulation layer 42 and the sealing metal layer 43 in the recess 41 prevent external force from being directly applied to the interface 40 that is located closer to the center of the semiconductor device than the recess 41. Thus, the reduction in the bonding force between the sensor section 10 and the cap section 20 at the interface 40 can be prevented.

Third Embodiment

Figure 9:
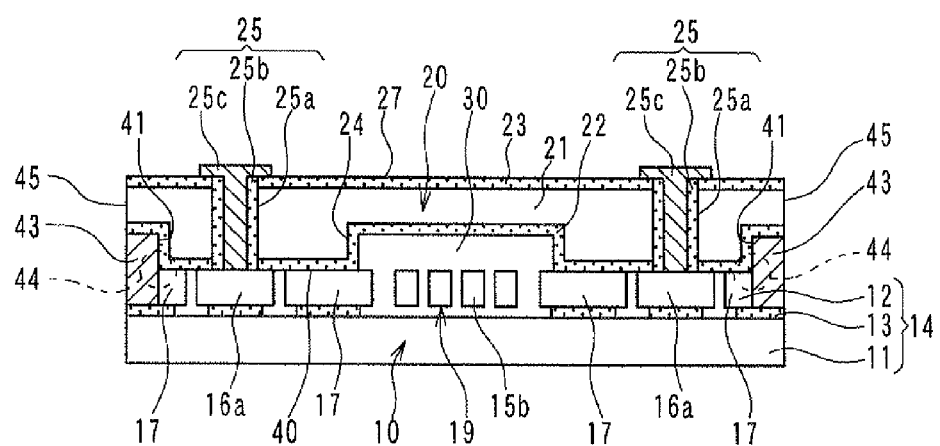
FIG. 9 is a diagram illustrating a cross-sectional view of a semiconductor device according to a third embodiment of the present invention.

A semiconductor device according to a third embodiment of the present invention is described below with reference to FIG. 9. FIG. 9, corresponding to FIG. 2, is a cross-sectional view of the semiconductor device according to the third embodiment. A difference between the third embodiment and the first embodiment is as follows.

According to the third embodiment, as shown in FIG. 9, the recess 41 penetrates at least the interface 40 between sensor section 10 and the cap section 20. In other words, the recess 41 is recessed in a side surface 45 of the semiconductor device so that at least the interface 40 between the sensor section 10 and the cap section 20 can be located in the recess 41. The recess 41 can fully surround the side surface 45 of the semiconductor device. Alternatively, the recess 41 can partially surround the side surface 45 of the semiconductor device.

The sealing metal layer 43 is located in the recess 41 to fill the sealing metal layer 43 so that the interface 40 can be covered with the sealing metal layer 43. The sealing metal layer 43 can be made of a metal material such as aluminum (Al). The sensor section 10, the cap section 20, and the sealing metal layer 43 in the recess 41 form the wedge 44.

The sealing metal layer 43 in the recess 41 serves as a shield for preventing external force from being directly applied to the interface 40 that is located closer to the center of the semiconductor device than the recess 41. Thus, the reduction in the bonding force between the sensor section 10 and the cap section 20 at the interface 40 can be prevented. Since the wedge 44 serves as a joint for joining the sensor section 10 and the cap section 20 together, the separation between the sensor section 10 and the cap section 20 at the interface 40 can be prevented.

Below, a method of manufacturing the semiconductor device of FIG. 9 is described below with further reference to FIGS. 10A, 10B and FIGS. 11A, 11B.

Firstly, the wafer-shaped SOI substrate 14 is formed into multiple sensor sections 10 by performing the processes shown in FIGS. 3A-3C.

Regarding the cap section 20, the recessed portion 24 is formed in the wafer-shaped silicon substrate 21 by performing the process shown in FIG. 4A. Further, in the process shown in FIG. 4A, a trench 28 (refer to FIG. 10A) is formed in the silicon substrate 21 at a position corresponding to the trench 50 of the sensor section 10. As described later, the trench 28 and the trench 50 form the recess 41. Then, in the process shown in FIG. 4B, the first and second insulation layers 22, 23 are formed on the first and second surfaces of the silicon substrate 21, respectively. Thus, the silicon substrate 21 is formed into multiple cap sections 20.

Figure 10A:
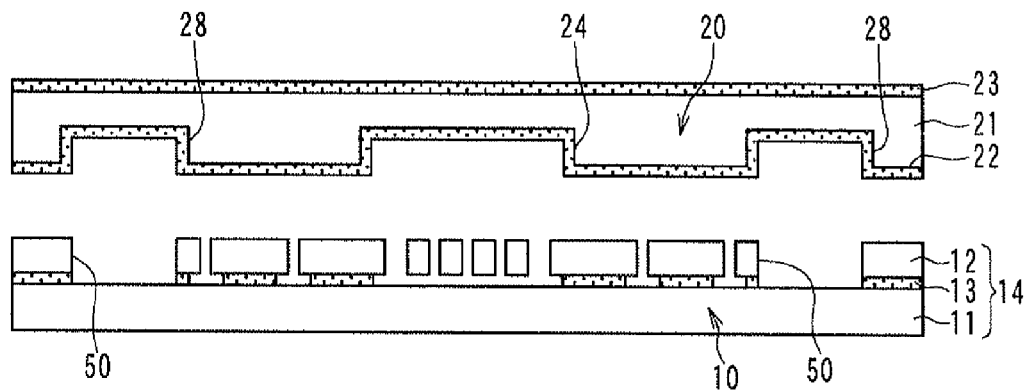
FIGS. 10A and 10B are diagrams illustrating processes of manufacturing the semiconductor device according to the third embodiment.

Then, in a process shown in FIG. 10A, as in the process shown in FIG. 5A, the SDI substrate 14 and the silicon substrate 21 are bonded together by direct bonding in the vacuum apparatus. In this way, the SOI substrate 14 and the silicon substrate 21 are bonded together to form the stacked substrate 52. Specifically, the SOI substrate 14 and the silicon substrate 21 are bonded together in such a manner that the trench 50 of the sensor section 10 can at least partially communicate with the trench 28 of the silicon substrate 21.

That is, there is no need that the trench 50 of the sensor section 10 should exactly communicate with the trench 28 of the silicon substrate 21.

Figure 10B:
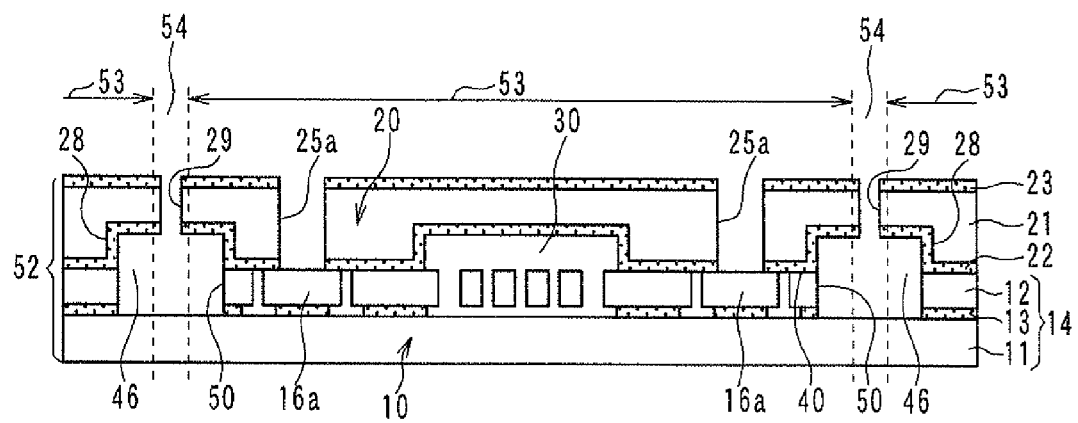

Thus, in each Chip region 53, the sealed space 30 is formed between the SOI substrate 14 and the recessed portion 24. As shown in FIG. 10B, a dicing line 54 along which the stacked substrate 52 is diced is located between adjacent chip regions 53.

When the trench 28 of the cap section 20 communicates with the trench 50 of the sensor section 10, a cavity 46 that is enclosed with the trenches 28, 50 is formed between the sensor section 10 and the cap section 20. A wall of the cavity 46 defines the recess 41.

As shown in FIG. 10A, according to the third embodiment, the width of the trench 50 is equal to the width of the trench 28 including the first insulation layer 22. Alternatively, the width of the trench 50 can be different from the width of the trench 28 including the first insulation layer 22.

Then, in a process shown in FIG. 10B, as in the process shown in FIG. 5B, multiple through holes 25a are formed in the stacked wafer 52. Further, in the process shown in FIG. 10B, multiple via holes 29 are formed in the stacked wafer 52 at the same time as the through holes 25a. The via hole 29 is located corresponding to the cavity 46 and reaches the cavity 46 by penetrating the first insulation layer 22, the silicon substrate 21, and the second insulation layer 23 of the cap section 20. Thus, the cavity 46 communicates with outside of the semiconductor device through the via hole 29. Alternatively, the via hole 29 can reach the cavity 46 by penetrating the supporting substrate 11 of the sensor section 10.

Figure 11A:
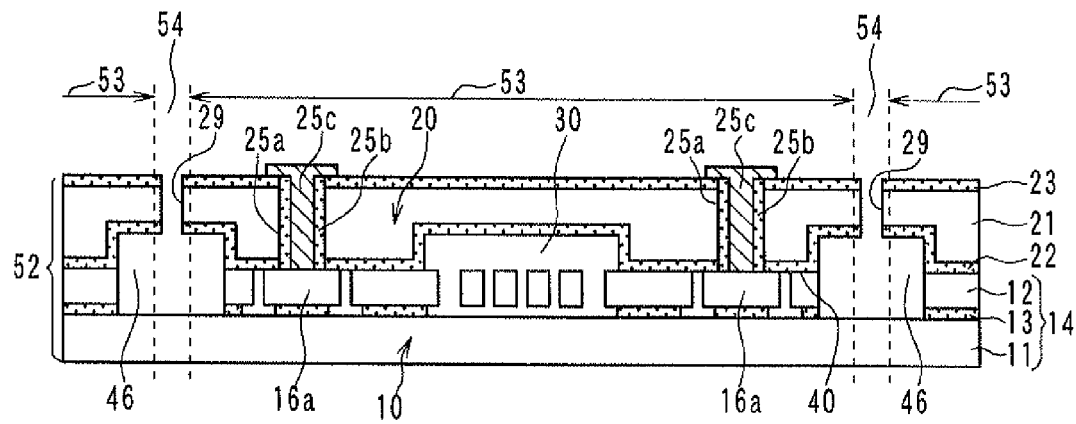
FIGS. 11A and 11B are diagrams illustrating processes following the processes of FIGS. 10A and 10B.

Then, in a process shown in FIG. 11A, the insulation layer 25b and the through electrode 25c are formed in each through hole 25a by performing the processes shown in FIGS. 5C, 5D, and FIG. 6. It is noted that a mask is used to prevent the insulation layer 25b and the through electrode 25c from being formed in the via hole 29.

Figure 11B:
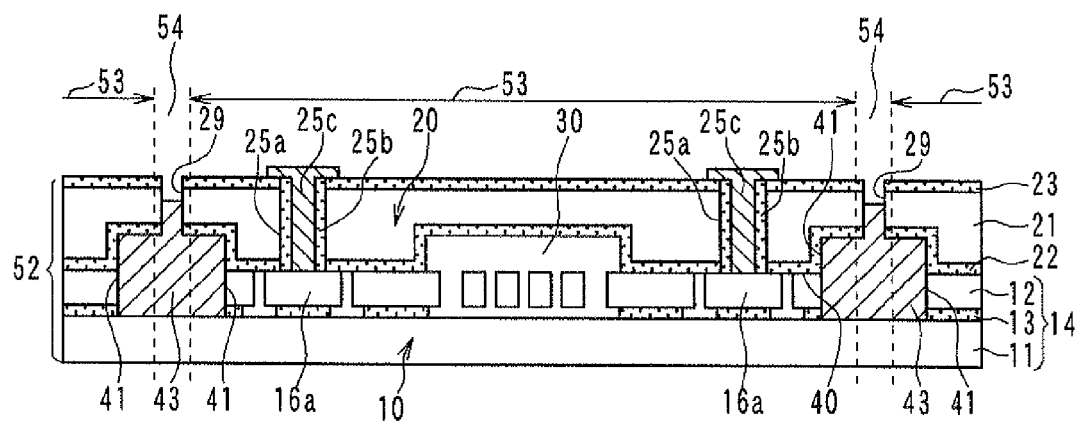

Then, in a process shown in FIG. 11B, the sealing metal layer 43 is placed in the cavity 46 through the via hole 29. Thus, the cavity 46 is filled with the sealing metal layer 43 so that the interface 40 between the sensor section 10 and the cap section 20 can be covered with the sealing metal layer 43.

After the cavity 46 is filled with the sealing metal layer 43, the stacked wafer 52 is diced along the dicing line 54. Thus, the stacked wafer 52 is divided into individual semiconductor devices, and the recess 41 is formed on the side surface 45 of the semiconductor device in such a manner that the interface 40 is located in the recess 41 and covered with the sealing metal layer 43.

As described above, according to the third embodiment, the recess 41 is formed on the side surface 45 of the semiconductor device in such a manner that at least the interface 40 between the sensor section 10 and the cap section 20 can be located in the recess 41. Therefore, the amount of the sealing metal layer 43 in the recess 41 can be reduced. It is noted that the sealing metal layer 43 is made of a material different from materials of which the sensor section 10 and the cap section 20 are made. Therefore, reducing the amount of the sealing metal layer 43 can reduce stress due to a difference in thermal coefficient of expansion between the sealing metal layer 43 and each of the sensor section 10 and the cap section 20.

The sealing metal layer 43 is partially formed on the side surface 45 of the semiconductor device. That is, according to the third embodiment, the sealing metal layer 43 and the silicon substrate 21 define the side surface 45 of the semiconductor device. Therefore, as compared to the structure shown in FIG. 2, the structure shown in FIG. 9 reduces the separation of the sealing metal layer 43 from the semiconductor device.

Fourth Embodiment

Figure 12:
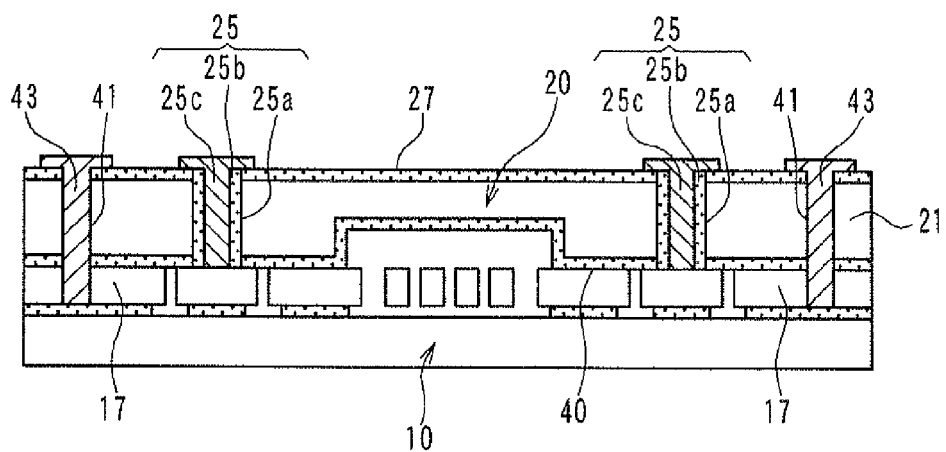
FIG. 12 is a diagram illustrating a cross-sectional view of a semiconductor device according to a fourth embodiment of the present invention.

A semiconductor device according to a fourth embodiment of the present invention is described below with reference to FIG. 12. FIG. 12, corresponding to FIG. 2, is a cross-sectional view of the semiconductor device according to the third embodiment. A difference between the fourth embodiment and the second embodiment is as follows. According to the fourth embodiment, the insulation layer 42 is not formed on the wall of the recess 41 so that the sealing metal layer 43 is directly formed in the recess 41.

Thus, the sealing metal layer 43 is electrically connected to the silicon substrate 21 of the cap section 20 and the peripheral portion 17 of the sensor section 10. Therefore, potentials of the silicon substrate 21 and the peripheral portion 17 are obtained through the sealing metal layer 43 so that the semiconductor device can be electrically shielded.

Further, since the insulation layer 42 is not formed, the manufacturing process can be simplified, and the manufacturing cost can be reduced.

Fifth Embodiment

Figure 13:
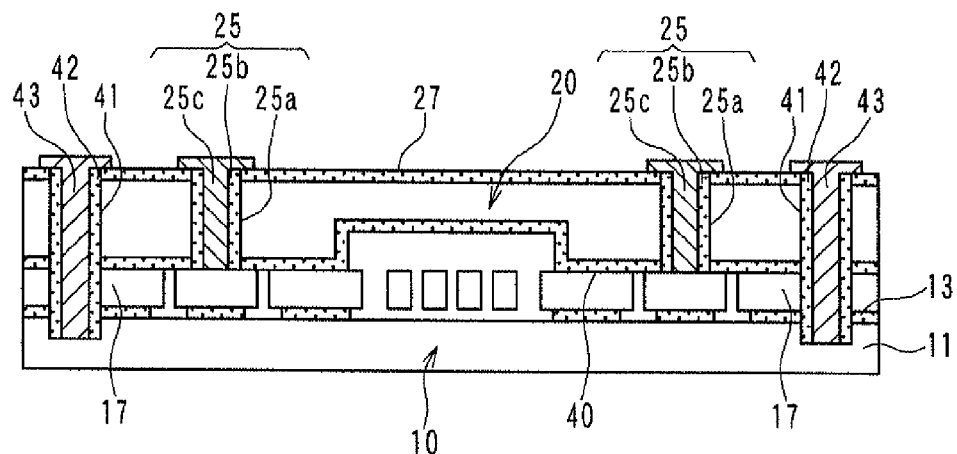
FIG. 13 is a diagram illustrating a cross-sectional view of a semiconductor device according to a fifth embodiment of the present invention.

A semiconductor device according to a fifth embodiment of the present invention is described below with reference to FIG. 13. FIG. 13, corresponding to FIG. 2, is a cross-sectional view of the semiconductor device according to the fifth embodiment. A difference between the fifth embodiment and the second embodiment is as follows.

According to the fifth embodiment, the recess 41 penetrates the sacrificial layer 13 of the sensor section 10 and reaches the supporting substrate 11. The insulation layer 42 is formed on the wall of the recess 41, and the sealing metal layer 43 is formed on the insulation layer 42 to fill the recess 41. It is noted that the insulation layer 42 on the bottom of the recess 41 is removed so that the sealing metal layer 43 can be electrically connected to the supporting substrate 11. Thus, the electrical potential of the supporting substrate 11 can be obtained through the sealing metal layer 43.

Sixth Embodiment

Figure 14:
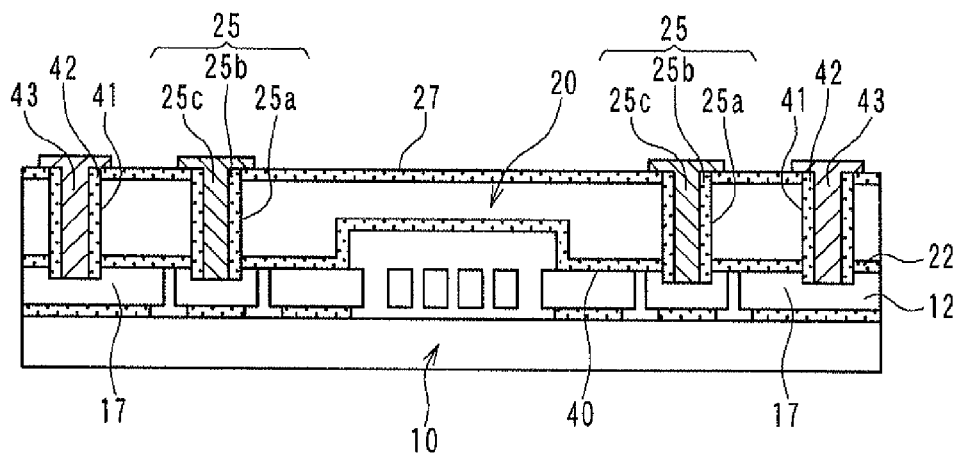
FIG. 14 is a diagram illustrating a cross-sectional view of a semiconductor device according to a sixth embodiment of the present invention.

A semiconductor device according to a sixth embodiment of the present invention is described below with reference to FIG. 14. FIG. 14, corresponding to FIG. 2, is a cross-sectional view of the semiconductor device according to the sixth embodiment. A difference between the sixth embodiment and the fifth embodiment is as follows.

According to the sixth embodiment, each of the through hole 25a and the recess 41 penetrates the first insulation layer 22 and reaches the semiconductor layer 12 For example, each of the through hole 25a and the recess 41 can have the same depth from the surface 27.

In such an approach, there is no need to form the trench 50 in the sensor section 10. Therefore, the through hole 25a and the recess 41 can be formed in the same process so that the manufacturing process can be simplified.

In the example shown in FIG. 14, the insulation layer 42 on the bottom of the recess 41 is removed. Therefore, the electrical potential of the peripheral portion 17 can be obtained through the sealing metal layer 43. Alternatively, the insulation layer 42 on the bottom of the recess 41 can be left. In such an case, the sealing metal layer 43 can serve to reduce the separation between the sensor section 10 and the cap section 20.

Seventh Embodiment

Figure 15:
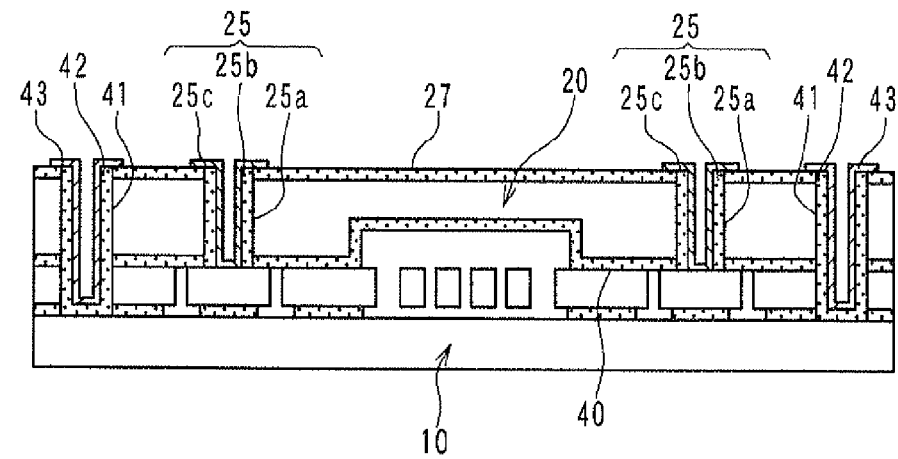
FIG. 15 is a diagram illustrating a cross-sectional view of a semiconductor device according to a seventh embodiment of the present invention.

A semiconductor device according to a seventh embodiment of the present invention is described below with reference to FIG. 15. FIG. 15, corresponding to FIG. 2, is a cross-sectional view of the semiconductor device according to the seventh embodiment. A difference between the seventh embodiment and the second embodiment is as follows.

According to the seventh embodiment, the through electrode 25c is formed in the through hole 25a not to fill the through hole 25a, and the sealing metal layer 43 is formed in the recess 41 not to fill the recess 41. For example, as shown in FIG. 15, the through electrode 25c can have a film-shape and formed on the insulation layer 25b and the bottom of the through hole 25a. Likewise, the sealing metal layer 43 can have a film-shape and formed on the insulation layer 42 and the bottom of the recess 41. In this way, there is no need that the through hole 25a be completely filled with the through electrode 25c and that the recess 41 be completely filled with the sealing metal layer 43.

In such an approach, the amount of a metal material such as aluminum used for the through electrode 25c and the sealing metal layer 43 is reduced so that the manufacturing cost can be reduced. Further, since the through hole 25a and the recess 41 are not completely filled, the stress due to a difference in thermal coefficient of expansion between the materials is reduced. Thus, it is less likely that the semiconductor device is broken by the stress.

Generally, it is easier to form the through electrode 25c and the sealing metal layer 43 in the shape of a film than to completely fill the through hole 25a and the recess 41 with the through electrode 25c and the sealing metal layer 43. Therefore, according to the seventh embodiment, the semiconductor device can be easy manufactured.

Eighth Embodiment

Figure 16:
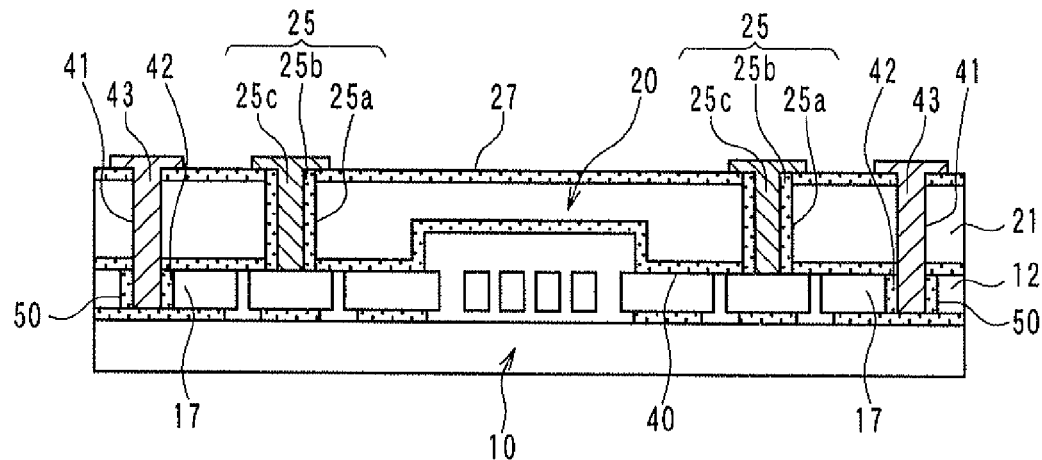
FIG. 16 is a diagram illustrating a cross-sectional view of a semiconductor device according to an eighth embodiment of the present invention.

A semiconductor device according to an eighth embodiment of the present invention is described below with reference to FIG. 16. FIG. 16, corresponding to FIG. 2, is a cross-sectional view of the semiconductor device according to the eighth embodiment. A difference between the eighth embodiment and the fourth embodiment is as follows.

According to the eighth embodiment, the insulation layer 42 is formed on the wall of the trench 50 of the semiconductor layer 12, but is not formed on the wall of the recess 41. Therefore, the sealing metal layer 43 is electrically connected to only the silicon substrate 21 of the cap section 20.

Ninth Embodiment

Figure 17:
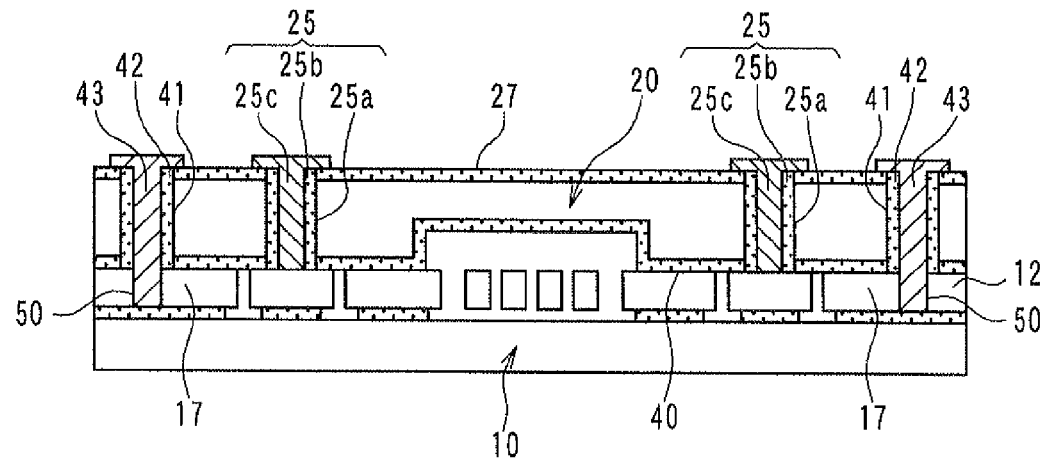
FIG. 17 is a diagram illustrating a cross-sectional view of a semiconductor device according to a ninth embodiment of the present invention.

A semiconductor device according to a ninth embodiment of the present invention is described below with reference to FIG. 17. FIG. 17, corresponding to FIG. 2, is a cross-sectional view of the semiconductor device according to the ninth embodiment. A difference between the ninth embodiment and the eighth embodiment is as follows.

According to the eighth embodiment, the insulation layer 42 is formed on the wall of the recess 41, but is not formed on the wall of the trench 50 of the semiconductor layer 12. Therefore, the sealing metal layer 43 is electrically connected to only the peripheral portion 17 in the semiconductor layer 12.

It is noted that the sealing metal layer 43 can be electrically connected to any other portion in the semiconductor layer 12.

Tenth Embodiment

Figure 18:
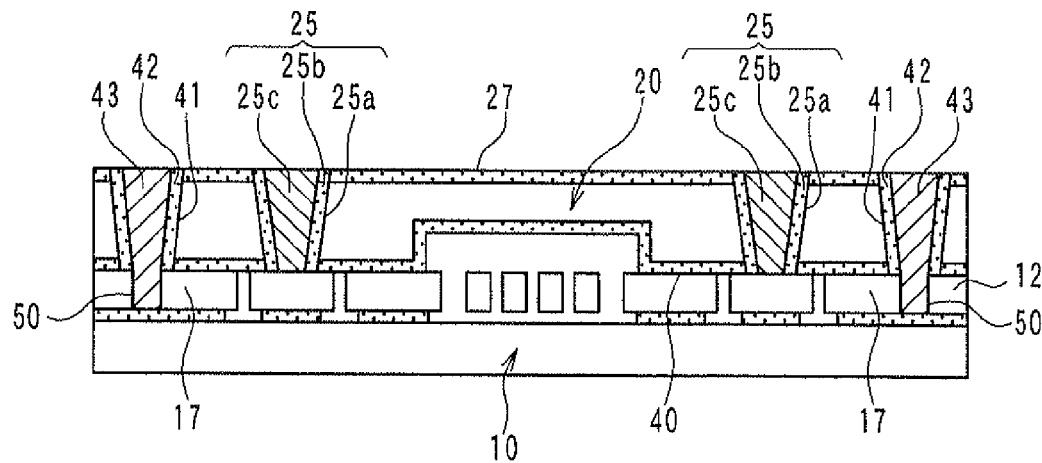
FIG. 18 is a diagram illustrating a cross-sectional view of a semiconductor device according to a tenth embodiment of the present invention.

A semiconductor device according to a tenth embodiment of the present invention is described below with reference to FIG. 18. FIG. 18, corresponding to FIG. 2, is a cross-sectional view of the semiconductor device according to the tenth embodiment. A difference between the tenth embodiment and the ninth embodiment is as follows.

According to the tenth embodiment, each of the through hole 25a and the recess 41 has a tapered shape. Specifically, the width of the through hole 25a becomes narrower from the opening to the bottom of the through hole 25a. In other words, the width of the through hole 25a becomes narrower from the surface 27 to the interface 40. Likewise, the width of the recess 41 becomes narrower from the opening to the bottom of the recess 41. In other words, the width of the recess 41 becomes narrower from the surface 27 to the interface 40.

Due to the tapered shape, the through hole 25a and the recess 41 can be easily formed. Further, the through electrode 25c and the sealing metal layer 43 can be easily formed on the walls of the through hole 25a and the recess 41 so that the through hole 25a and the recess 41 can be easily filled with the through electrode 25c and the sealing metal layer 43.

In the example shown in FIG. 18, the insulation layer 42 is not formed in the trench 50 of the semiconductor layer 12 so that the electrical potential of the peripheral portion 17 can be obtained through the sealing metal layer 43. Alternatively, the insulation layer 42 can be formed in the trench 50 of the semiconductor layer 12.

For example, the recess 41 can be tapered in the process shown in FIG. 5B. Alternatively, a taped via hole can be formed in the cap section 20 in the process shown in FIG. 4C, and then the cap section 20 having the tapered via hole can be bonded to the sensor section 10 in the process shown in FIG. 5A.

Eleventh Embodiment

Figure 19A:
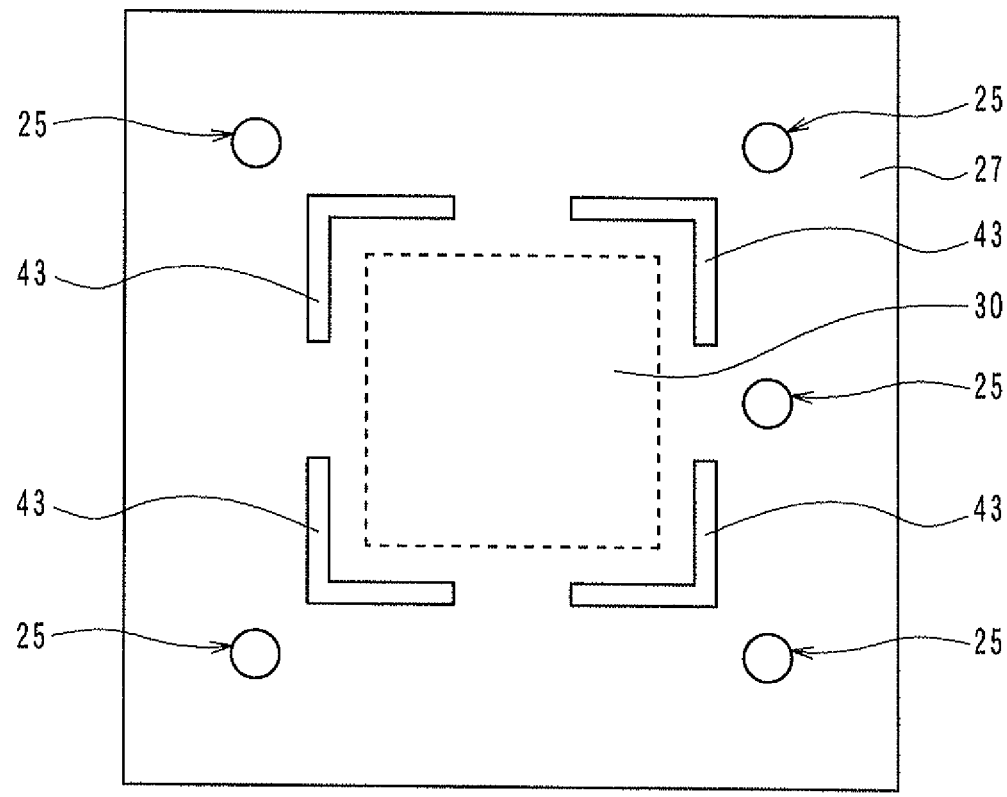
FIG. 19A is a diagram illustrating a plan view of a semiconductor device according to an eleventh embodiment of the present invention.
Figure 19B:
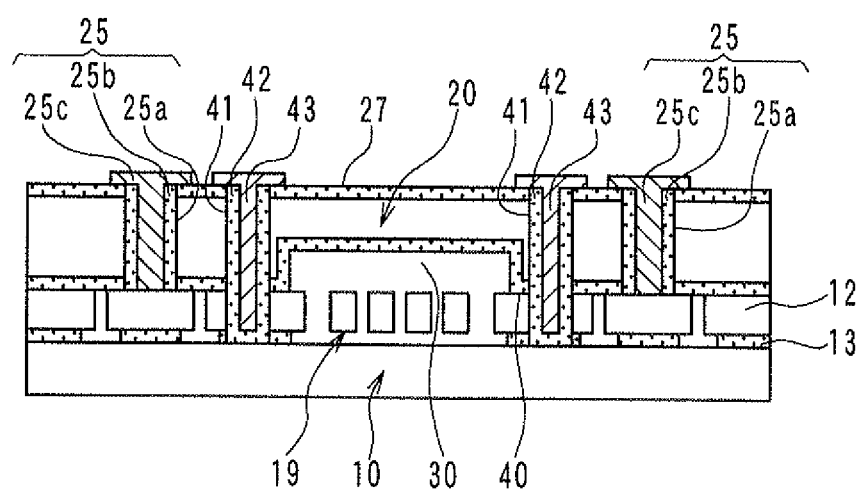
FIG. 19B is a diagram illustrating a cross-sectional view of the semiconductor device according to the eleventh embodiment.

A semiconductor device according to an eleventh embodiment of the present invention is described below with reference to FIGS. 19A and 19B. FIG. 19A is a plan view of the semiconductor device according to the eleventh embodiment. FIG. 19B, corresponding to FIG. 2, is a cross-sectional view of the semiconductor device of FIG. 19A. A difference between the eleventh embodiment and the eleventh embodiment is as follows.

According to the tenth embodiment, the sealing metal layer 43 is located closer to the sealed space 30 than the through electrode member 25. In other words, the recess 41 (i.e., the sealing metal layer 43) is located closer to the center of the surface 27 of the cap section 20 (i.e., the sealed space 30) than the through electrode member 25 when the cap section 20 is viewed from the stacked direction.

In the example shown in FIG. 19B, the recess 41 reaches the sacrificial layer 13 so that the semiconductor layer 12 is divided by the recess 41. Therefore, the recess 41 partially (e.g., intermittently) surrounds the sealed space 30 so that the movable portion 15 and the fixed portion 16 in the semiconductor layer 12 can be electrically connected to the through electrode member 25.

Alternatively, the recess 41 can reach the semiconductor layer 12 by penetrating the interface 40. In such an approach, the movable portion 15 and the fixed portion 16 can be electrically connected to the through electrode member 25 through the semiconductor layer 12. In this case, the recess 41 can fully surrounds the sealed space 30.

As described above, according to the tenth embodiment, the sealing metal layer 43 is located closer to the sealed space 30 than the through electrode member 25. In such an approach, the airtightness of the sealed space 30 can be improved. Further, since the sealing metal layer 43 is located near the sensing portion 19, the sealing metal layer 43 can serve as a shielding layer for electrically shielding the sensing portion 19.

Twelfth Embodiment

Figure 20A:
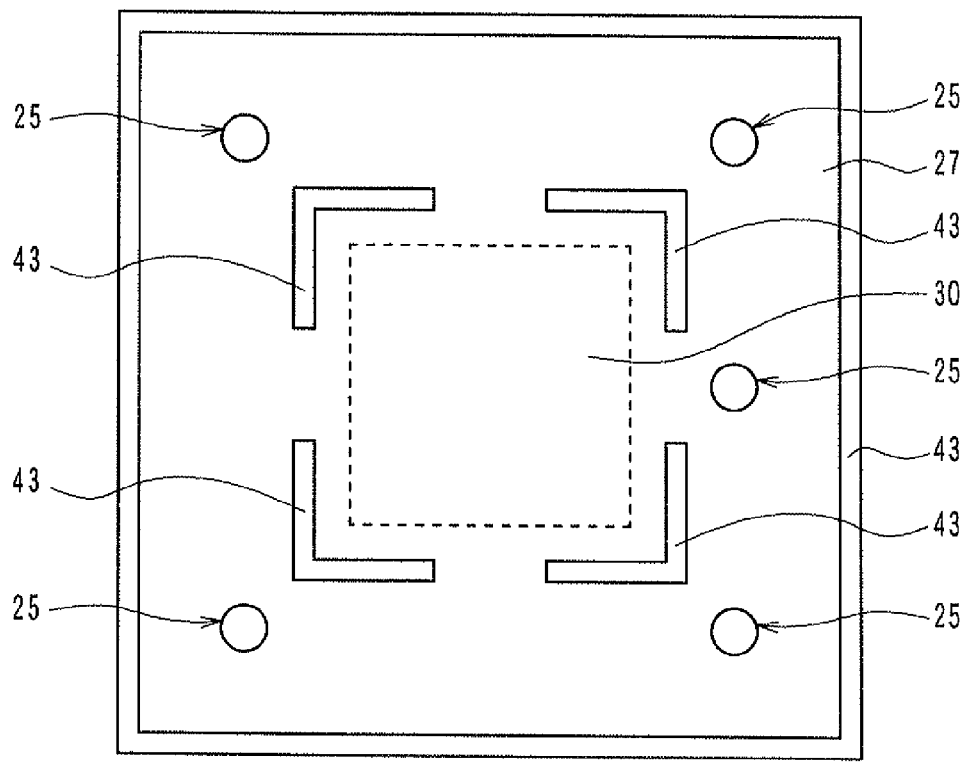
FIG. 20A is a diagram illustrating a plan view of a semiconductor device according to a twelfth embodiment of the present invention.
Figure 20B:
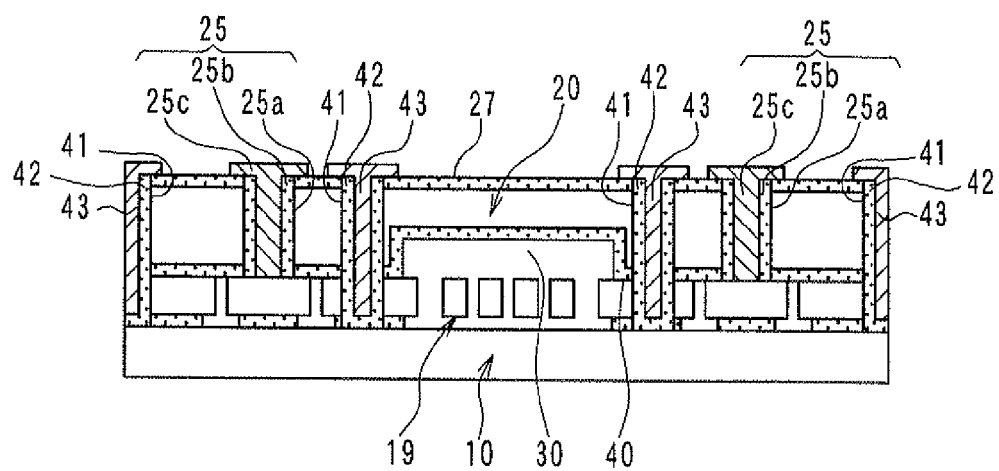
FIG. 20B is a diagram illustrating a cross-sectional view of the semiconductor device according to the twelfth embodiment.

A semiconductor device according to a twelfth embodiment of the present invention is described below with reference to FIGS. 20A and 20B. FIG. 20A is a plan view of the semiconductor device according to the twelfth embodiment. FIG. 20B, corresponding to FIG. 2, is a cross-sectional view of the semiconductor device of FIG. 20A. A difference between the twelfth embodiment and the eleventh embodiment is as follows.

According to the twelfth embodiment, the sealing metal layer 43 is located between the sealed space 30 and the through electrode member 25 and also located to define the side surface of the semiconductor device. In other words, the recess 41 is located closer to the center of the surface 27 of the cap section 20 than the through electrode member 25 and also located on the outermost edge of the surface 27 of the cap section 20, when the cap section 20 is viewed from the stacked direction. In this way, the recess 41 is formed on each side of the through electrode member 25, when the cap section 20 is viewed from the stacked direction. In the example shown in FIG. 20B, the recess 41 reaches the sacrificial layer 13.

In summary, according to the twelfth embodiment, the sealing metal layer 43 is doubled so that the airtightness of the entire semiconductor device can be improved. Further, the sealing metal layer 43 can serve as a shielding layer.

In the example shown in FIG. 10B, the insulation layer 42 is formed on the wall of the recess 41 that is located to define the side surface of the semiconductor device. Alternatively, the sealing metal layer 43 can be directly formed on the wall of the recess 41 that is located to define the side surface of the semiconductor device. In such an approach, the sealing metal layer 43 in the recess 41 that is located to define the side surface of the semiconductor device can be electrically connected to the silicon substrate 21 of the cap section 20.

Thirteenth Embodiment

Figure 21A:
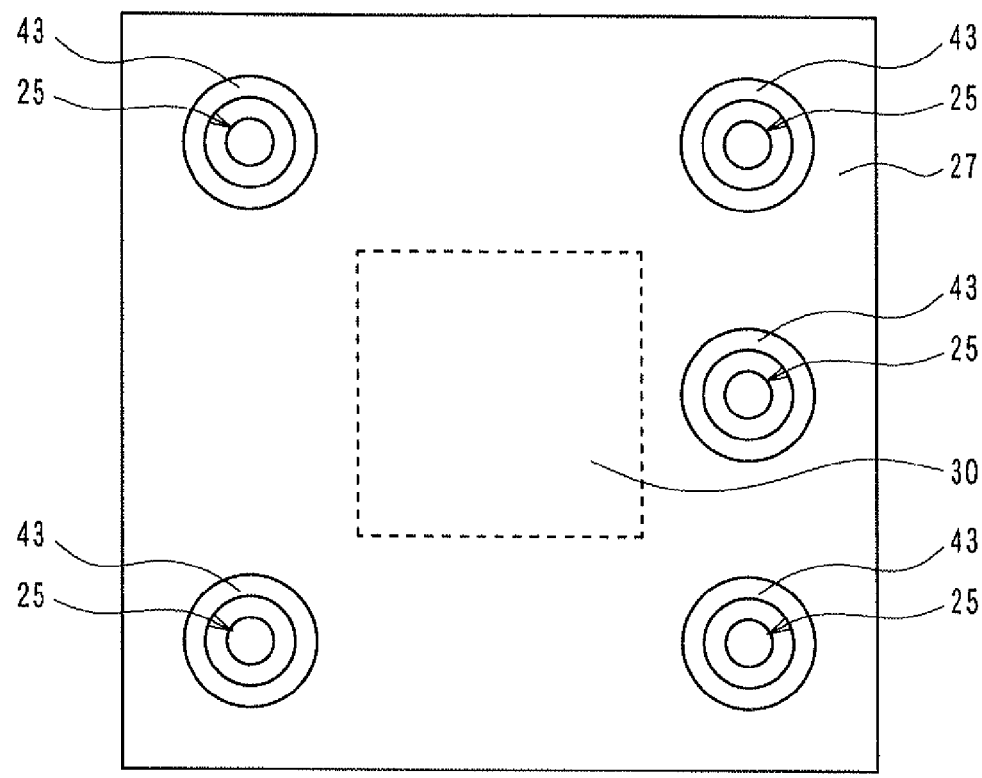
FIG. 21A is a diagram illustrating a plan view of a semiconductor device according to a thirteenth embodiment of the present invention.
Figure 21B:
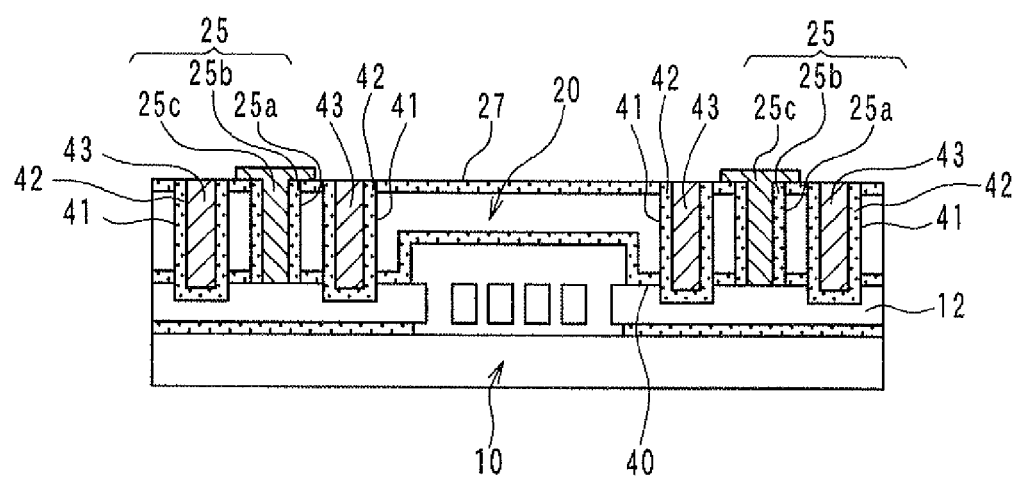
FIG. 21B is a diagram illustrating a cross-sectional view of the semiconductor device according to the thirteenth embodiment.

A semiconductor device according to a thirteenth embodiment of the present invention is described below with reference to FIGS. 21A and 21B. FIG. 21A is a plan view of the semiconductor device according to the thirteenth embodiment. FIG. 21B, corresponding to FIG. 2, is a cross-sectional view of the semiconductor device of FIG. 21A. A difference between the thirteenth embodiment and the second embodiment is as follows.

According to the thirteenth embodiment, as shown in FIG. 21A, the recess 41 has a ring-shape to surround the through electrode member 25. Further, as shown in FIG. 21B, the through electrode member 25 reaches the semiconductor layer 12 so that the through electrode 25c can be electrically connected to the semiconductor layer 12.

In such an approach, the airtightness can be improved around the of the through electrode member 25. Further, the sealing metal layer 43 can serve as a shielding layer around the through electrode member 25.

(Modifications)

The embodiments described above can be modified in various ways, for example. As follows.

In the embodiments, the recess 41 is filled with the insulation layer 42 and the sealing metal layer 43. Alternatively, the recess 41 can be filled with other material such as titanium (Ti), copper (Cu), nickel (Ni), tungsten (W), germanium (Ge), indium (In), polysilicon, insulation, rubber, resin, resist, $SiO_2$, $Si_3N_4$, or $Al_2O_3$.

In the embodiments, the through electrode 25c is made of aluminum. Alternatively, the through electrode 25c can be made of other metal material such as Cu, Ni, W, Ge, or In.

In the embodiments, the sensor section 10 and the cap section 20 are bonded together by direct bonding. Alternatively, the sensor section 10 and the cap section 20 can be bonded together by other bonding method such as surface activation bonding, eutectic bonding, anodic bonding, adhesive layer bonding, or solder bonding.

In the embodiments, the silicon substrate 21 of the cap section 20 has the recessed portion 24. Alternatively, the silicon substrate 21 can have no recessed portion 24. In this case, the thicknesses of the weight 15b, the beam 15d, and the movable electrode 15c can be reduced by their maximum displacement amount to form a clearance between the silicon substrate 21 and each of the weight 15b, the beam 15d, and the movable electrode 15c. The clearance can allow the weight 15b, the beam 15d, and the movable electrode 15c to be displaced in their thickness direction.

Figure 22A:
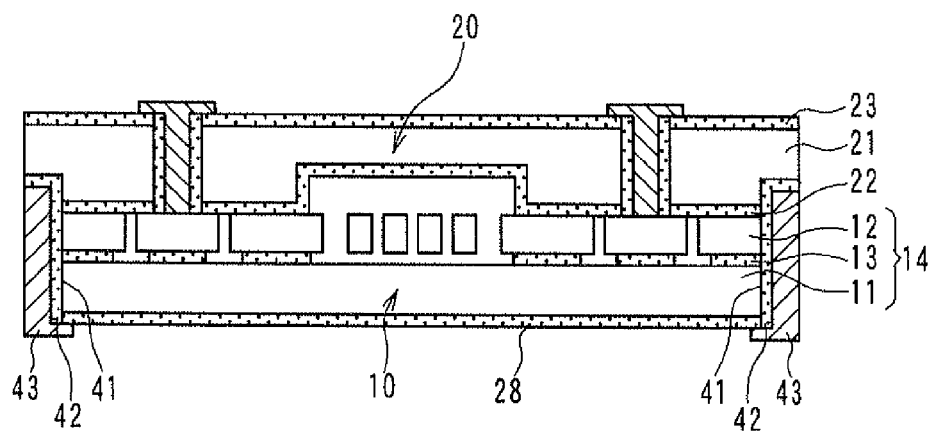
FIG. 22A is a diagram illustrating a cross-sectional view of a semiconductor device according to a first modification.

In the embodiments, the opening of the recess 41 is located on the cap section 20 side, and the bottom of the recess 41 is located on the sensor section 10 side. Alternatively, as shown in FIGS. 21A and 21B, the opening of the recess 41 can be located on the sensor section 10 side, and the bottom of the recess 41 can be located on the cap section 20 side. FIG. 22A corresponds to a modification of the first embodiment. In the modification shown in FIG. 22A, an insulation layer 28 is formed on a back surface of the supporting substrate 11 of the SOI substrate 14. That is, the insulation layer 28 is located opposite to the sacrificial layer 13 across the supporting substrate 11. The recess 41 reaches the silicon substrate 21 by penetrating the insulation layer 25, the SOI substrate 14, and the first insulation layer 22.

Thus, in the modification shown in FIG. 22A, the recess 41 extends between the sensor section 10 and the cap section 20 to penetrate the interface 40 between the sensor section 10 and the cap section 20. In such a structure, the insulation layer 42 and the sealing metal layer 43 in the recess 41 can serve as a shield for preventing external force from being directly applied to the interface 40 between the sensor section 10 and the cap section 20, an interface between the supporting substrate 11 and the sacrificial layer 13, and an interface between the sacrificial layer 13 and the semiconductor layer 12.

Figure 22B:
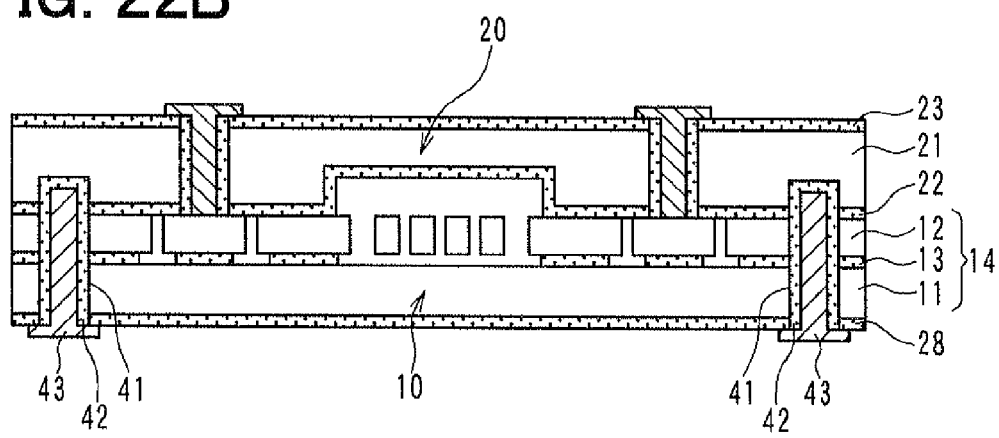
FIG. 22B is a diagram illustrating a cross-sectional view of a semiconductor device according to a second modification.

FIG. 22B corresponds to a modification of the second embodiment. As shown in FIG. 22B, the second embodiment can be modified in such a manner that the opening of the recess 41 is located on the sensor section 10 side, and the bottom of the recess 41 is located on the cap section 20 side.

Figure 23A:
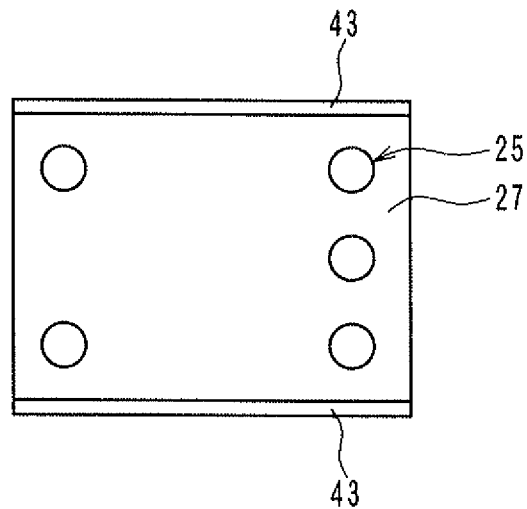
FIG. 23A is a diagram illustrating a plan view of a cap section of a semiconductor device according to a third modification.
Figure 23B:
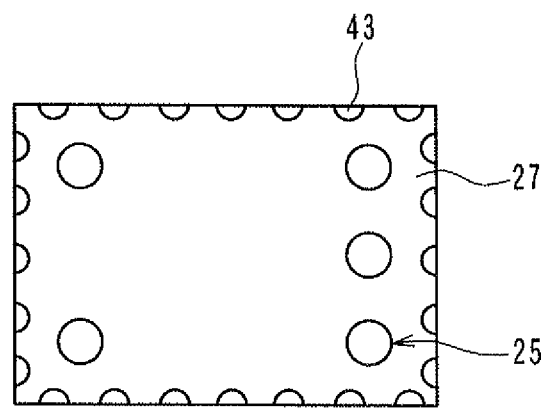
FIG. 23B is a diagram illustrating a cross-sectional view of a cap section of a semiconductor device according to a fourth modification.
Figure 23C:
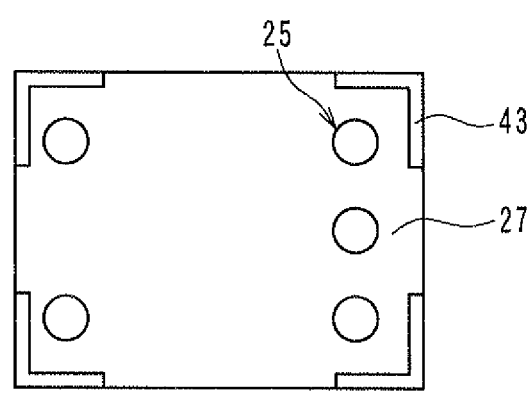
FIG. 23C is a diagram illustrating a cross-sectional view of a cap section of a semiconductor device according to a fifth modification.

In the embodiments, the recess 41 is laid out in such a manner that the recess 41 is located on the entire outer edge on the surface 27 of the cap section 20. Alternatively, as shown in FIGS. 23A-23C, the recess 41 can be laid out in a different manner. It is noted that the insulation layer 42 is omitted in FIGS. 23A-23C.

In FIG. 23A, the sealing metal layer 43 is laid out in such a manner that the sealing metal layer 43 is located along two opposing sides of the surface 27 of the cap section 20. That is, the sealing metal layer 43 is located along a predetermined side of the surface 27 of the cap section 20. Accordingly, the wedge 44 is located along the predetermined side of the surface 27 of the cap section 20. Therefore, when external force is applied to the predetermined side of the semiconductor device, the external force is applied to the sealing metal layer 43. In this way, since the external force is not directly applied to the interface 40, the separation between the sensor section 10 and the cap section 20 can be effectively prevented. Although FIG. 23A depicts a case where the sealing metal layer 43 is located along two opposing sides of the surface 27 of the cap section 20, the sealing metal layer 43 can be located along at least one side of the surface 27 of the cap section 20. For example, the sealing metal layer 43 can be located along only one side of the surface 27 of the cap section 20, or the sealing metal layer 43 can be located along three sides of the surface 27 of the cap section 20.

In FIG. 23B, the sealing metal layer 43 is laid out in such a manner that the sealing metal layer 43 is intermittently arranged on the outer edge of the surface 27 of the cap section 20 at a predetermined interval. Accordingly, the wedge 44 is intermittently arranged on the outer edge of the surface 27 of the cap section 20. When the sealing metal layer 43 is intermittently arranged, the interface 40 between the sensor section 10 and the cap section 20 is intermittently covered by the sealing metal layer 43. Therefore, external stress directly applied to the interface 40 is reduced so that the separation between the sensor section 10 and the cap section 20 can be reduced. Further, since the sealing metal layer 43 is intermittently arranged, the amount of a material used to form the sealing metal layer 43 can be reduced. Although FIG. 23B depicts a case where the sealing metal material 43 has a circular shape on the surface 27, the sealing metal material 43 can have other shape on the surface 27. For example, the sealing metal material 43 can have a polygonal shape on the surface 27.

In FIG. 23C, the sealing metal layer 43 is laid out in such a manner that the sealing metal layer 43 is arranged on only a corner of the surface 27 of the cap section 20. Even when the sealing metal layer 43 is arranged on only a corner of the surface 27 of the cap section 20, the separation between the sensor section 10 and the cap section 20 can be reduced. Further, since the sealing metal layer 43 is located outside the through electrode member 25, electrical connection of the through electrode member 25 can be ensured by reducing the separation between the sensor section 10 and the cap section 20.

In the modifications shown in FIGS. 23A-23C, the insulation layer 42 and the sealing metal layer 43 are exposed to the dicing surface (i.e., side surface) of the semiconductor device. Alternatively, the modifications shown in FIGS. 23A-23C can be applied to a case like the second embodiment, where the insulation layer 42 and the sealing metal layer 43 are not exposed to the side surface of the semiconductor device, like the second embodiment. Alternatively, the modifications shown in FIGS. 23A-23C can be applied to a case like FIGS. 22A and 22B, where the opening of the recess 41 is located on the sensor section 10 side, and the bottom of the recess 41 is located on the cap section 20 side.

In the embodiments, after the sensor section 10 and the cap section 20 are bonded together, the through electrode member 25 is formed in the cap section 20. Alternatively, before the sensor section 10 and the cap section 20 are bonded together, the through electrode member 25 can be formed in the cap section 20. In this case, the through electrode member 25 can be electrically connected to the peripheral portion 17 and the sensing portion 19, when the cap section 20 is bonded to the sensor section 10.

In the embodiments, the sensing portion 19 is configured to detect an acceleration. Alternatively, the sensing portion 19 can be configured to detect other physical quantity such as an angular velocity. Further, the present invention can be applied to a sensor other than an acceleration sensor or an angular velocity sensor.

For example, the present invention can be applied to a pressure sensor, in which a first substrate having a diaphragm responsive to pressure is bonded to a second substrate so that a space under a reference pressure can be formed between the first substrate and the second substrate. In this case, a recess penetrating an interface between the first substrate and the second substrate is formed to maintain the space under the reference pressure, and a sealing material is placed in the recess to form a wedge. In this way, the present invention can be applied to a device, in which two substrates are bonded together so that a space can be formed between the substrates.

Further, the present invention can be applied to a device, in which two substrates are bonded together so that no space can be formed between the substrates. That is, a reduction in a bonding force between the substrates can be reduced by forming a recess penetrating an interface between first and second substrates and by placing a sealing material in the recess.

In the embodiments, the sensor section 10 is based on the SOI substrate 14, and the cap section 20 is based on the silicon substrate 21. That is, the sensor section 10 is based on three layer substrate, and the cap section 20 is based on three layer substrate. This is only an example. Therefore, each of the sensor section 10 and the cap section 20 can be based on a single layer substrate or a multilayer substrate. For example, in a case of a three layer substrate, the recess is formed in such a manner that the recess penetrates not only an interface between a first layer and a second layer but also an interface between the second layer and a third layer. It is noted that the recess is filled with a sealing material. The same can hold true for more than three layer substrate. The recess can be formed either a front side or a back side of a stacked substrate. Alternatively, the recess can be formed both side of the stacked substrate.

Such changes and modifications are to be understood as being within the scope of the present invention as defined by the appended claims.

What is claimed is:

1. A semiconductor device comprising:
a first semiconductor substrate having a surface and including a sensing portion on the surface side, the sensing portion having a movable portion;
a second semiconductor substrate having first and second surfaces opposite to each other,
the first surface of the second semiconductor substrate bonded to the surface of the first semiconductor substrate to form a stacked substrate,
the stacked substrate defining a hermetically sealed space for accommodating the sensing portion between the first and second semiconductor substrates,
the stacked substrate further defining a recess extending between the first and second semiconductor substrates to penetrate an interface between the first and second substrates; and
a sealing member in the recess, wherein
the second semiconductor substrate includes a through electrode extending from the first surface to the second surface of the second semiconductor substrate and electrically connected to the sensing portion of the first semiconductor substrate, and
the recess comprises at least two recess portions,
one recess portion being located closer to a center of the second surface of the second semiconductor substrate than the through electrode, and
the other recess portion being located closer to an outer edge of the second surface of the second semiconductor substrate than the through electrode.

* * * * *